United States Patent
Bae et al.

(10) Patent No.: US 9,559,046 B2
(45) Date of Patent: Jan. 31, 2017

(54) SEMICONDUCTOR DEVICE AND METHOD OF FORMING A FAN-IN PACKAGE-ON-PACKAGE STRUCTURE USING THROUGH SILICON VIAS

(75) Inventors: Hyunil Bae, Kyoungki-do (KR); Youngchul Kim, Kyoungki-do (KR); Myungkil Lee, Kyungki-do (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 1257 days.

(21) Appl. No.: 12/209,838

(22) Filed: Sep. 12, 2008

(65) Prior Publication Data

US 2010/0065948 A1    Mar. 18, 2010

(51) Int. Cl.
*H01L 21/00*    (2006.01)
*H01L 23/498*    (2006.01)
(Continued)

(52) U.S. Cl.
CPC ....... *H01L 23/49816* (2013.01); *H01L 21/563* (2013.01); *H01L 23/481* (2013.01); *H01L 24/17* (2013.01); *H01L 24/73* (2013.01); *H01L 25/03* (2013.01); *H01L 25/0652* (2013.01); *H01L 25/0655* (2013.01); *H01L 25/0657* (2013.01); *H01L 25/105* (2013.01); *H01L 25/50* (2013.01); *H01L 23/3128* (2013.01); *H01L 23/525* (2013.01); *H01L 24/05* (2013.01); *H01L 24/16* (2013.01); *H01L 24/29* (2013.01); *H01L 24/32* (2013.01); *H01L 24/48* (2013.01); *H01L 2224/0401* (2013.01); *H01L 2224/13025* (2013.01); *H01L 2224/13099* (2013.01); *H01L 2224/16145* (2013.01); *H01L 2224/16225* (2013.01); *H01L 2224/16235* (2013.01); *H01L 2224/17181* (2013.01); *H01L 2224/32225* (2013.01); *H01L 2224/48091* (2013.01); *H01L 2224/48227* (2013.01); *H01L 2224/73203* (2013.01); *H01L 2224/73204* (2013.01); *H01L 2224/73253* (2013.01);
(Continued)

(58) Field of Classification Search
None
See application file for complete search history.

(56) References Cited

U.S. PATENT DOCUMENTS 6,084,308 A  *  7/2000  Kelkar et al. ................. 257/777
6,659,512 B1 * 12/2003  Harper et al. ................. 257/777
(Continued)

*Primary Examiner* — Marvin Payen
(74) *Attorney, Agent, or Firm* — Robert D. Atkins; Patent Law Group: Atkins and Associates, P.C.

(57) ABSTRACT

A semiconductor device is made by providing a first semiconductor die having a plurality of contact pads formed over a first surface of the first semiconductor die and having a plurality of through-silicon vias (TSVs) formed within the first semiconductor die. A second semiconductor die is mounted to the first surface of the first semiconductor die using a plurality of solder bumps. At least one of the solder bumps is in electrical communication with the TSVs in the first semiconductor die. The second semiconductor die is mounted to a printed circuit board (PCB) using an adhesive material. A plurality of solder bumps is formed to connect the contact pads of the first semiconductor die to the PCB. An encapsulant is deposited over the first semiconductor die and the second semiconductor die. An interconnect structure is formed over a back surface of the PCB.

24 Claims, 15 Drawing Sheets

(51) Int. Cl.
*H01L 21/56* (2006.01)
*H01L 23/48* (2006.01)
*H01L 25/065* (2006.01)
*H01L 25/10* (2006.01)
*H01L 25/00* (2006.01)
*H01L 25/03* (2006.01)
H01L 23/31 (2006.01)
H01L 23/525 (2006.01)
H01L 23/00 (2006.01)

(52) U.S. Cl.
CPC ........... *H01L 2224/73265* (2013.01); *H01L 2225/0651* (2013.01); *H01L 2225/06517* (2013.01); *H01L 2225/06541* (2013.01); *H01L 2225/1023* (2013.01); *H01L 2225/1058* (2013.01); *H01L 2924/0103* (2013.01); *H01L 2924/01013* (2013.01); *H01L 2924/01029* (2013.01); *H01L 2924/01047* (2013.01); *H01L 2924/01078* (2013.01); *H01L 2924/01079* (2013.01); *H01L 2924/01082* (2013.01); *H01L 2924/01322* (2013.01); *H01L 2924/12041* (2013.01); *H01L 2924/1306* (2013.01); *H01L 2924/13091* (2013.01); *H01L 2924/14* (2013.01); *H01L 2924/1433* (2013.01); *H01L 2924/1532* (2013.01); *H01L 2924/15174* (2013.01); *H01L 2924/15184* (2013.01); *H01L 2924/15311* (2013.01); *H01L 2924/15331* (2013.01); *H01L 2924/181* (2013.01); *H01L 2924/19041* (2013.01); *H01L 2924/19042* (2013.01); *H01L 2924/19043* (2013.01); *H01L 2924/19105* (2013.01); *H01L 2924/19107* (2013.01); *H01L 2924/30105* (2013.01)

(56) References Cited

U.S. PATENT DOCUMENTS

| | | | |
|---|---|---|---|
| 6,828,665 | B2 | 12/2004 | Pu et al. |
| 7,279,795 | B2 | 10/2007 | Periaman et al. |
| 2006/0220256 | A1* | 10/2006 | Shim et al. .................. 257/777 |
| 2008/0088011 | A1* | 4/2008 | Hu .................. H01L 21/568 257/723 |
| 2008/0237310 | A1* | 10/2008 | Periaman et al. ......... 228/180.5 |
| 2009/0152740 | A1* | 6/2009 | Park .................. H01L 23/552 257/778 |
| 2009/0206455 | A1* | 8/2009 | Harper .............. H01L 23/3128 257/659 |

* cited by examiner

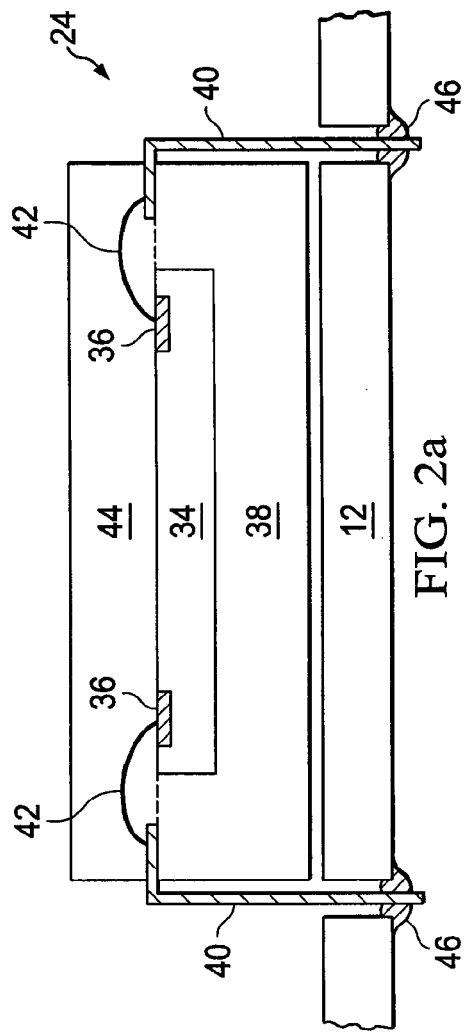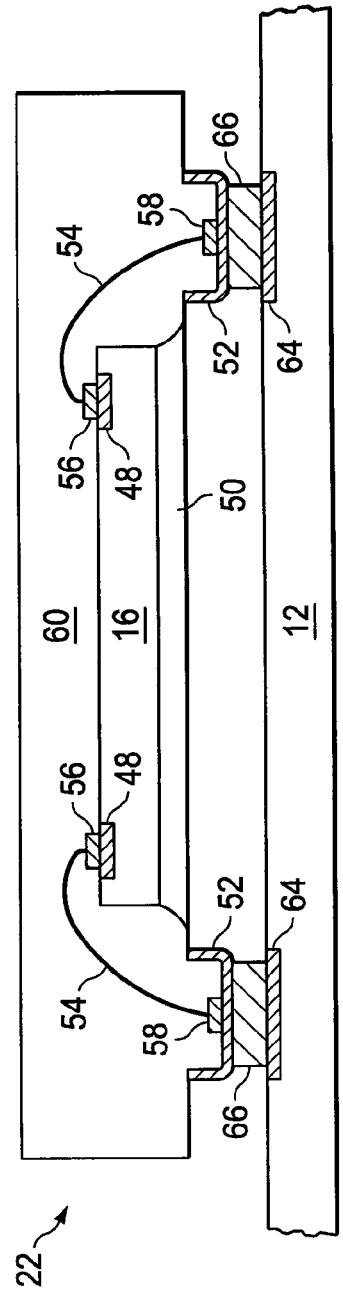
FIG. 2a
FIG. 2b

SEMICONDUCTOR DEVICE AND METHOD OF FORMING A FAN-IN PACKAGE-ON-PACKAGE STRUCTURE USING THROUGH SILICON VIAS

FIELD OF THE INVENTION

The present invention relates in general to semiconductor devices and, more particularly, to a semiconductor device having a chip-on-chip package and a plurality of through-silicon vias for package interconnect.

BACKGROUND OF THE INVENTION

Semiconductor devices are ubiquitous in modern electronic products. Semiconductor devices vary in the number and density of electrical components. Discrete semiconductor devices generally contain one type of electrical component, e.g., light emitting diode (LED), transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power generation, networks, computers, and consumer products. Semiconductor devices are also found in electronic products including military, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material.

A semiconductor device contains active and passive electrical structures. Active structures, including transistors, control the flow of electrical current. By varying levels of doping and application of an electric field, the transistor either promotes or restricts the flow of electrical current. Passive structures, including resistors, diodes, and inductors, create a relationship between voltage and current necessary to perform a variety of electrical functions. The passive and active structures are electrically connected to form logic circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

In many applications, it is desirable to stack a plurality of semiconductor die over one another to form a stacked semiconductor package. However, as an increasing number of semiconductor die or other IC chips are stacked over one another, the overall size of the semiconductor package increases. For example, in packages including three or more die or chips, the package requires several substrates to facilitate the formation of electrical interconnections between each of the semiconductor die and chips. In conventional packages, for example, three substrates are often required when forming fan-in package-on-package (fiPOP) packages to form the necessary connections between top, middle, and bottom die, chips or packages.

SUMMARY OF THE INVENTION

In one embodiment, the present invention is a method of making a semiconductor device comprising providing a first semiconductor die having a plurality of contact pads formed over a first surface of the first semiconductor die and having a plurality of through-silicon vias (TSVs) formed within the first semiconductor die, and mounting a second semiconductor die to the first surface of the first semiconductor die using a plurality of solder bumps. One of the solder bumps is in electrical communication with the TSVs in the first semiconductor die. The method includes mounting the second semiconductor die to a printed circuit board (PCB) using an adhesive material, forming a plurality of solder bumps to connect the contact pads of the first semiconductor die to the PCB, depositing an encapsulant over the first semiconductor die and the second semiconductor die, and forming an interconnect structure over a back surface of the PCB.

In another embodiment, the present invention is a method of making a semiconductor device comprising providing a first semiconductor die having a contact pad formed over a surface of the first semiconductor die and having a through-silicon via (TSV) formed within the first semiconductor die, and mounting a second semiconductor die to the first semiconductor die. The second semiconductor die is electrically connected to the TSV in the first semiconductor die. The method includes mounting the second semiconductor die to a printed circuit board (PCB) using an adhesive material, and connecting the first semiconductor die to the PCB.

In another embodiment, the present invention is a method of making a semiconductor device comprising providing a first semiconductor die having a through-silicon via (TSV) formed within the first semiconductor die, and mounting a second semiconductor die to the first semiconductor die. The second semiconductor die is electrically connected to the TSV in the first semiconductor die. The method includes mounting the second semiconductor die to a substrate, connecting the first semiconductor die to the substrate, and mounting a semiconductor package to the first semiconductor die.

In another embodiment, the present invention is a semiconductor device comprising a first semiconductor die having a contact pad formed over a surface of the first semiconductor die and having a through-silicon via (TSV) formed within the first semiconductor die, and a second semiconductor die mounted to the first semiconductor die. The second semiconductor die is electrically connected to the TSV in the first semiconductor die. The device includes a printed circuit board (PCB). The second semiconductor die is mounted to the PCB using an adhesive material. The first semiconductor die is connected to the PCB. The device includes an encapsulant deposited over the first semiconductor die and the second semiconductor die.

BRIEF DESCRIPTION OF THE DRAWINGS

FIGS. 2a-2c illustrate further detail of the representative semiconductor packages mounted to the PCB;

FIG. 6 illustrates a fiPOP package having a wire bonded die package bottom, a flip chip bonded die package bottom, a plurality of discrete components and a semiconductor package mounted to the fiPOP package;

FIG. 7 illustrates a fiPOP package having a flip chip package bottom configured to connect directly to a motherboard or other primary printed circuit board (PCB);

DETAILED DESCRIPTION OF THE DRAWINGS

Figure 1:
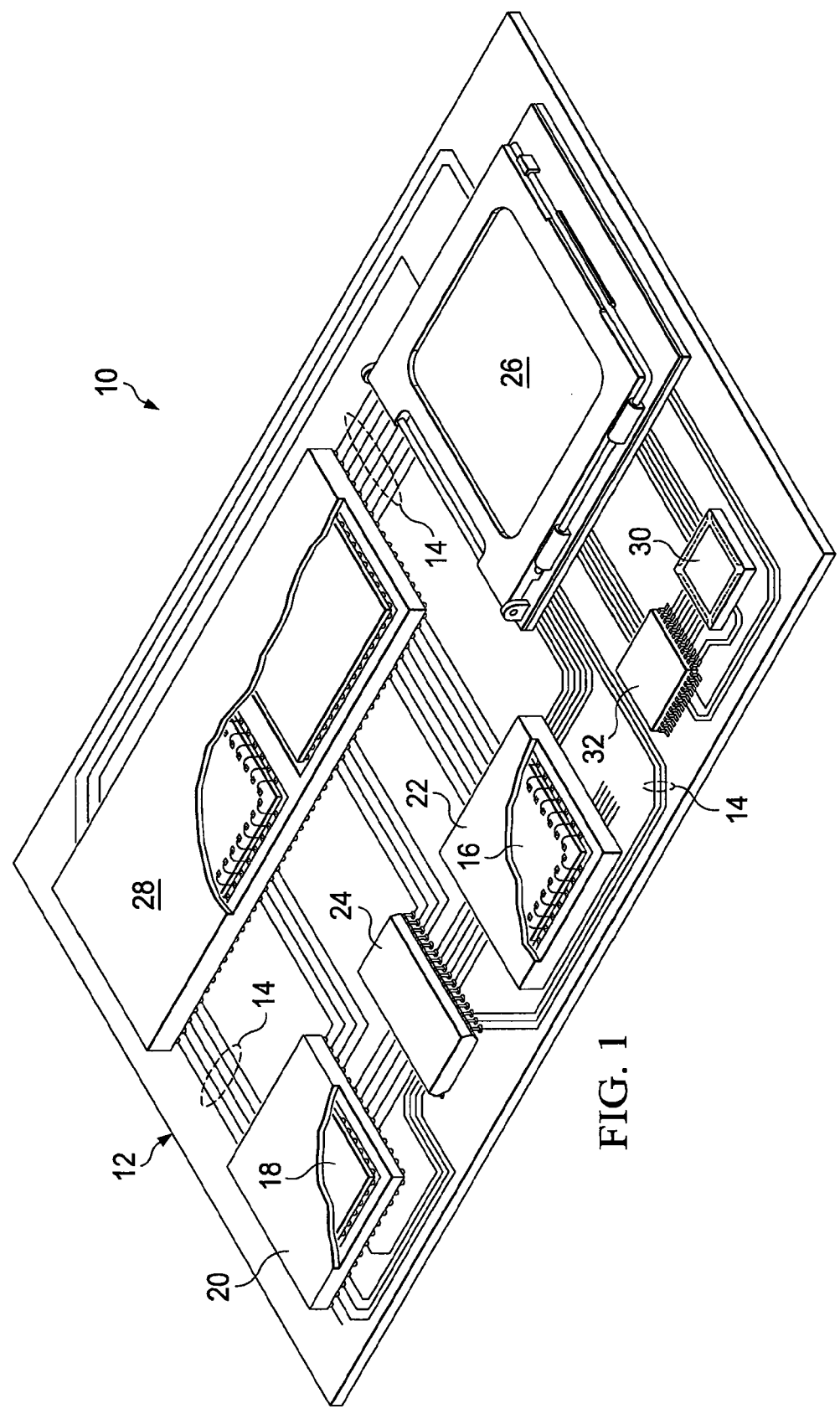
FIG. 1 illustrates a printed circuit board (PCB) with different types of packages mounted to its surface.

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components which are electrically connected to form circuits. Active electrical components, such as transistors, have the ability to control the flow of electrical current. Passive electrical components, such as capacitors, inductors, resistors, and transformers, create a relationship between voltage and current necessary to perform electrical circuit functions.

Passive and active components are formed on the surface of the semiconductor wafer by a series of process steps including doping, thin film deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into a permanent insulator, permanent conductor, or changing the way the semiconductor material changes in conductivity in response to an electric field. Transistors contain regions of varying types and degrees of doping arranged as necessary to enable the transistor to promote or restrict the flow of electrical current upon the application of an electric field.

Active and passive components are formed by layers of materials with different electrical properties. The layers can be formed by thin film deposition. The type of material being deposited determines the thin film deposition technique. The thin film deposition techniques include chemical vapor deposition (CVD), physical vapor deposition (PVD), electrolytic plating, and electroless plating processes. Each layer is generally patterned to form portions of active-components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Some types of materials are patterned without being etched; instead patterns are formed by directly depositing the material into the areas or voids formed by a previous deposition/etch process using techniques such as electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting device or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 10 having a chip carrier substrate or printed circuit board (PCB) 12 with a plurality of semiconductor packages mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 12 provides a general substrate for structural support and electrical interconnect of the semiconductor packages mounted on the PCB. Conductive signal traces 14 are formed on a surface or within layers of PCB 12 using evaporation, electrolytic plating, electroless plating, screen printing, or other suitable metal deposition process. Signal traces 14 provide for electrical communication between each of the semiconductor packages, mounted components, and other external system components. Traces 14 also provide power and ground connections to each of the semiconductor packages.

In some embodiments, a semiconductor device has two packaging levels. First level packaging is the technique for mechanically and electrically attaching the semiconductor die to a carrier. Second level packaging involves mechanically and electrically attaching the carrier to the PCB. In other embodiments, a semiconductor device may only have the first level packaging where the die is mechanically and electrically attached directly to the PCB.

For the purpose of illustration, several types of first level packaging, including wire bond package 16 and flip chip 18, are shown on PCB 12. Additionally, several types of second level packaging, including ball grid array (BGA) 20, bump chip carrier (BCC) 22, dual in-line package (DIP) 24, land grid array (LGA) 26, multi-chip module (MCM) 28, quad flat non-leaded package (QFN) 30, and quad flat package 32, are shown mounted on PCB 12. Depending upon the system requirements, any combination of semiconductor packages, configured with any combination of first and second level packaging styles, as well as other electronic components, can be connected to PCB 12. In some embodiments, electronic device 10 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a shorter manufacturing process. The resulting devices are less likely to fail and less expensive to manufacture resulting in lower costs for consumers.

FIG. 2a illustrates further detail of DIP 24 mounted on PCB 12. DIP 24 includes semiconductor die 34 having contact pads 36. Semiconductor die 34 includes an active area containing analog or digital circuits implemented as active devices, passive devices, conductive layers, and dielectric layers formed within semiconductor die 34 and are electrically interconnected according to the electrical design of the die. For example, the circuit may include one or more transistors, diodes, inductors, capacitors, resistors, and other circuit elements formed within the active area of die 34. Contact pads 36 are made with a conductive material, such as aluminum (Al), copper (Cu), tin (Sn), nickel (Ni), gold (Au), or silver (Ag), and are electrically connected to the circuit elements formed within die 34. Contact pads 36 are formed by PVD, CVD, electrolytic plating, or electroless plating process. During assembly of DIP 24, semiconductor die 34 is mounted to a carrier 38 using a gold-silicon eutectic layer or adhesive material such as thermal epoxy. The package body includes an insulative packaging material such as plastic or ceramic. Conductor leads 40 are connected to carrier 38 and wire bonds 42 are formed between leads 40 and contact pads 36 of die 34 as a first level packaging. Encapsulant 44 is deposited over the package for environmental protection by preventing moisture and particles from entering the package and contaminating die 34, contact pads 36, or wire bonds 42. DIP 24 is connected to PCB 12 by inserting leads 40 into holes formed through PCB 12. Solder material 46 is flowed around leads 40 and into the holes to physically and electrically connect DIP 24 to PCB 12. Solder material 46 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high-lead, or lead-free.

FIG. 2b illustrates further detail of BCC 22 mounted on PCB 12. Semiconductor die 16 is connected to a carrier by wire bond style first level packaging. BCC 22 is mounted to PCB 12 with a BCC style second level packaging. Semiconductor die 16 having contact pads 48 is mounted over a carrier using an underfill or epoxy-resin adhesive material 50. Semiconductor die 16 includes an active area containing analog or digital circuits implemented as active devices, passive devices, conductive layers, and dielectric layers formed within semiconductor die 16 and are electrically interconnected according to the electrical design of the die. For example, the circuit may include one or more transistors, diodes, inductors, capacitors, resistors, and other circuit elements formed within the active area of die 16. Contact pads 48 are made with a conductive material, such as Al, Cu, Sn, Ni, Au, or Ag, and are electrically connected to the circuit elements formed within die 16. Contact pads 48 are formed by PVD, CVD, electrolytic plating, or electroless plating process. Wire bonds 54 and bond pads 56 and 58 electrically connect contact pads 48 of semiconductor die 16 to contact pads 52 of BCC 22 forming the first level packaging. Molding compound or encapsulant 60 is deposited over semiconductor die 16, wire bonds 54, contact pads 48, and contact pads 52 to provide physical support and electrical isolation for the device. Contact pads 64 are formed on a surface of PCB 12 using evaporation, electrolytic plating, electroless plating, screen printing, or other suitable metal deposition process and are typically plated to prevent oxidation. Contact pads 64 electrically connect to one or more conductive signal traces 14. Solder material is deposited between contact pads 52 of BCC 22 and contact pads 64 of PCB 12. The solder material is reflowed to form bumps 66 which form a mechanical and electrical connection between BCC 22 and PCB 12.

Figure 2C:
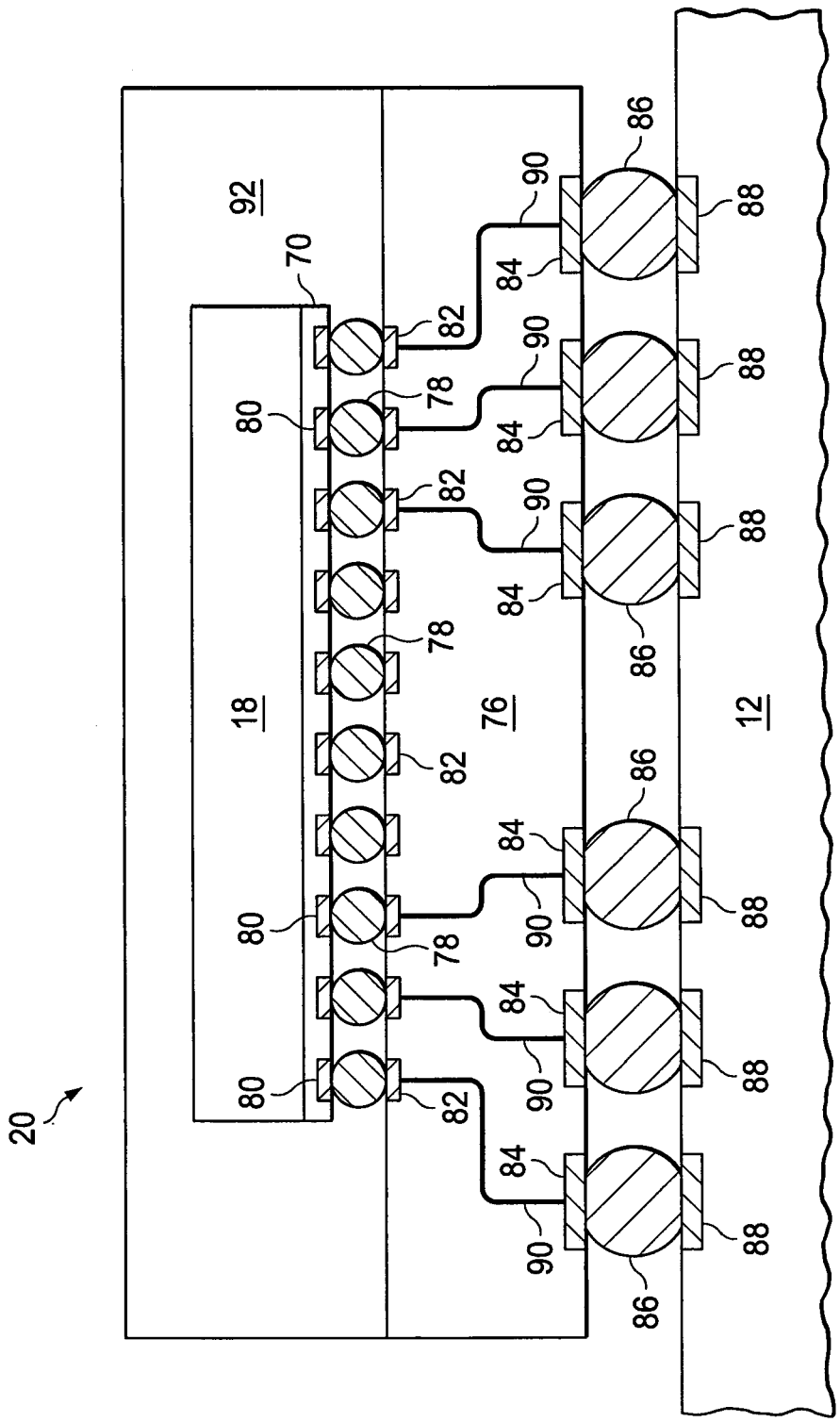

In FIG. 2c, semiconductor die 18 is mounted face down to carrier 76 with a flip chip style first level packaging. BGA 20 is attached to PCB 12 with a BGA style second level packaging. Active area 70 containing analog or digital circuits implemented as active devices, passive devices, conductive layers, and dielectric layers formed within semiconductor die 18 is electrically interconnected according to the electrical design of the die. For example, the circuit may include one or more transistors, diodes, inductors, capacitors, resistors, and other circuit elements formed within active area 70 of semiconductor die 18. Semiconductor die 18 is electrically and mechanically attached to the carrier 76 through a large number of individual conductive solder bumps or balls 78. Solder bumps 78 are formed on bump pads or interconnect sites 80, which are disposed on active areas 70. Bump pads 80 are made with a conductive material, such as Al, Cu, Sn, Ni, Au, or Ag, and are electrically connected to the circuit elements formed in active area 70. Bump pads 80 are formed by PVD, CVD, electrolytic plating, or electroless plating process. Solder bumps 78 are electrically and mechanically connected to contact pads or interconnect sites 82 on carrier 76 by a solder reflow process.

BGA 20 is electrically and mechanically attached to PCB 12 by a large number of individual conductive solder bumps or balls 86. The solder bumps are formed on bump pads or interconnect sites 84. The bump pads 84 are electrically connected to interconnect sites 82 through conductive lines 90 routed through carrier 76. Contact pads 88 are formed on a surface of PCB 12 using evaporation, electrolytic plating, electroless plating, screen printing, or other suitable metal deposition process and are typically plated to prevent oxidation. Contact pads 88 electrically connect to one or more conductive signal traces 14. The solder bumps 86 are electrically and mechanically connected to contact pads or bonding pads 88 on PCB 12 by a solder reflow process. Molding compound or encapsulant 92 is deposited over semiconductor die 18 and carrier 76 to provide physical support and electrical isolation for the device. The flip chip semiconductor device provides a short electrical conduction path from the active devices on semiconductor die 18 to conduction tracks on PCB 12 in order to reduce signal propagation distance, lower capacitance, and achieve overall better circuit performance. In another embodiment, the semiconductor die 18 can be mechanically and electrically attached directly to PCB 12 using flip chip style first level packaging without carrier 76.

Figure 3A:
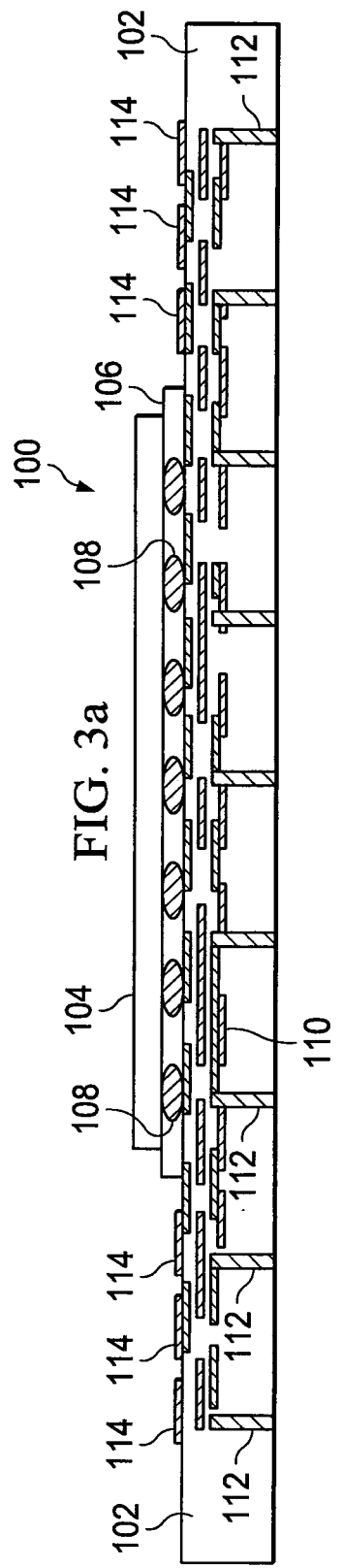
FIGS. 3a-3c illustrate a method of forming a fan-in package-on-package (fiPOP) package using semiconductor dies or chips having through-silicon vias (TSVs)
Figure 3B:
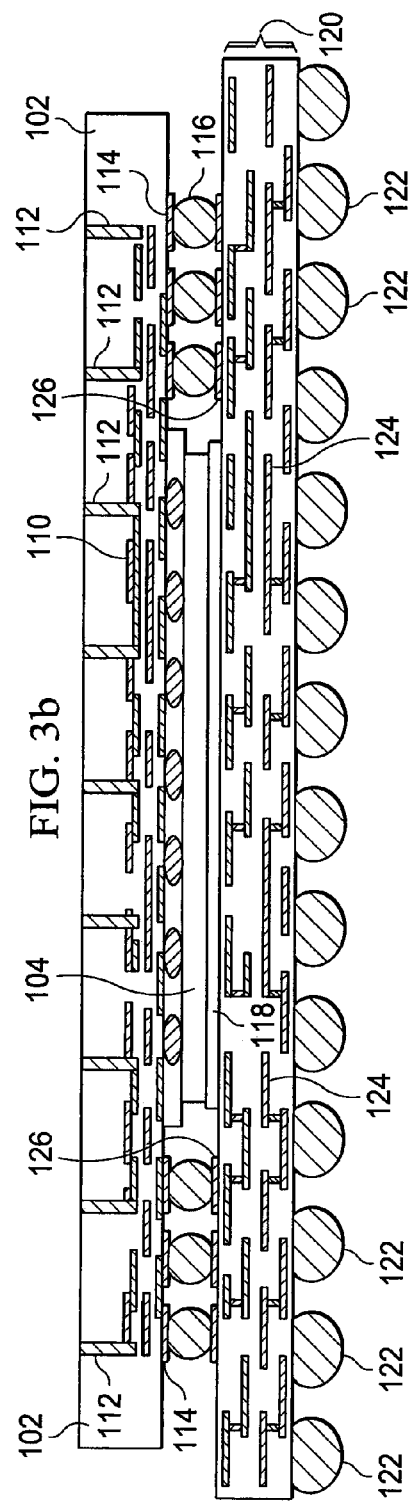
Figure 3C:
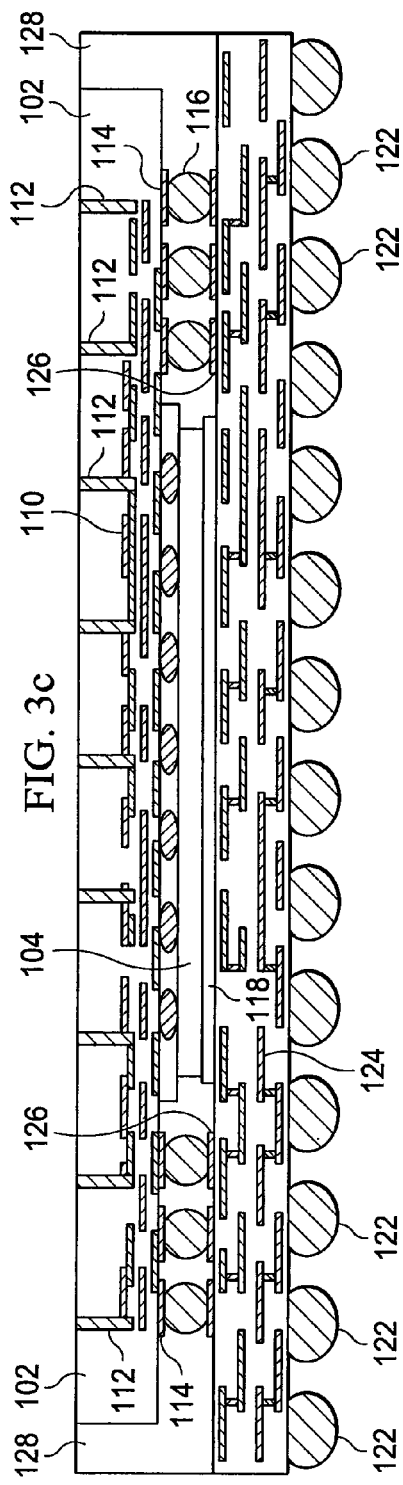

FIGS. 3a-3c illustrate a method of forming fan-in package-on-package (fiPOP) 100 using semiconductor dies or chips having through-silicon vias (TSVs). Turning to FIG. 3a, semiconductor die 104 is mounted over semiconductor die 102. Semiconductor dies 102 and 104 include semiconductor devices, or other electronic chips or ICs and provide various functions such as memory, controllers, ASICs, processors, microcontrollers, or combinations thereof. With reference to FIG. 3a, die 104 is flip chip mounted to die 102 using flip chip interconnection methods as described above. Solder bumps 108 are reflowed to form conductive bumps between contact pads formed over die 104 (not shown) and contact pads formed over die 102 (not shown). The contact pads are formed over a surface of dies 102 and 104 using a PVD, CVD, electrolytic plating, or electroless plating process and include a conductive material. Bumps 108 form both an electrical and mechanical bond between dies 102 and 104. Underfill 106 is deposited between dies 102 and 104 to further enhance the mechanical bond between dies 102 and 104. Underfill 106 may include a die attach adhesive or other epoxy polymer material for bonding the dies together. Die 102 includes build-up structure 110 to provide an electrical interconnection network for routing electrical signals from the contact pads of die 102 to both the electrical circuits formed within die 102 and TSVs 112 formed in die 102. Build-up structure 110 includes dielectric layers, metalized redistribution layers, and/or under bump metallurgy layers, and is disposed over the active surface of die 102. TSVs 112 are formed by first etching or laser drilling the surface of die 102 to form a recessed portion. A conductive material such as copper (Cu), silver (Ag), or gold (Au) is deposited into the recessed portions to form TSVs 112. TSVs 112 connect to build-up structure 110 and are in electrical communication with the contact pads formed over a surface of die 102. Additional contact pads 114 are formed over a top surface of die 102 for connecting external system components. Contact pads 114 are formed using a PVD, CVD, electrolytic plating, or electroless plating process and include a conductive material.

Turning to FIG. 3b, package 100 is inverted and mounted to printed circuit board (PCB) 120. PCB 120 includes a general substrate material such as a BT-laminate PCB for structural support and electrical interconnect of the semiconductor packages and other electronic components mounted on or connected to PCB 120. Contact pads 126 are formed on a surface of PCB 120. Conductive traces and/or build-up structure 124 is formed within layers of PCB 120 using evaporation, electrolytic plating, electroless plating, screen printing, or other suitable metal deposition process. Build-up structure 124 provides for electrical communication between each of the mounted dies, connected external system components, and contact pads 126. When mounting package 100, solder bumps 116 are first connected to contact pads 114 of die 102. Package 100 is then inverted and solder bumps 116 are connected to contact pads 126 of PCB 120 using a reflow process. Bumps 116 form an electrical and mechanical connection between die 102 and PCB 120. Adhesive material 118 is deposited between die 104 and PCB 120 to further enhance the mechanical connection between die 104 and PCB 120. Adhesive 118 may include an underfill or epoxy-resin material.

Solder bumps 122 are formed over a bottom surface of PCB 120 using a reflow process. Solder bumps 122 include Au, or Cu structures or another conductive material such as Sn/Pb, CuZn, or CuAg solder each containing an optional flux material. In alternative embodiments, solder bumps 122 are replaced by conductive studs or pillars, wirebonds, or other interconnect structures for connecting to other system components. After integration, the functionality of dies 102 and 104 is made available to the external system components. Additional system components, passive devices, or discrete components may be connected to device 100 through bumps 122 or another interconnect structure to provide additional functionality.

Turning to FIG. 3c, molding or encapsulation material 128 is deposited over device 100 to provide physical support and electrical insulation. Molding 128 includes non-conductive materials such as a polymer molding compound, liquid epoxy molding, compression molding, or other molding or encapsulating materials. Having integrated dies 102 and 104, package 100 can be connected to external systems using interconnect structure or bumps 122.

Using the above method, a package is fabricated that includes a fiPOP structure having chip-on-chip (COC) components and TSVs. A top chip in the package is connected through TSVs to a bottom substrate of the package via a plurality of solder bumps. In one embodiment, the bottom chip is mounted using a capillary-deposited underfill material. Alternatively, a molded underfill may be used to mount the bottom chip. The package is formed without the use of wirebonds which would require a more complicated and expensive fabrication process. Using these methods, a fiPOP package is formed with fewer substrates for mounting the components of the package, which reduces fabrication and material costs and minimizes the overall height of the finished package.

Figure 4:
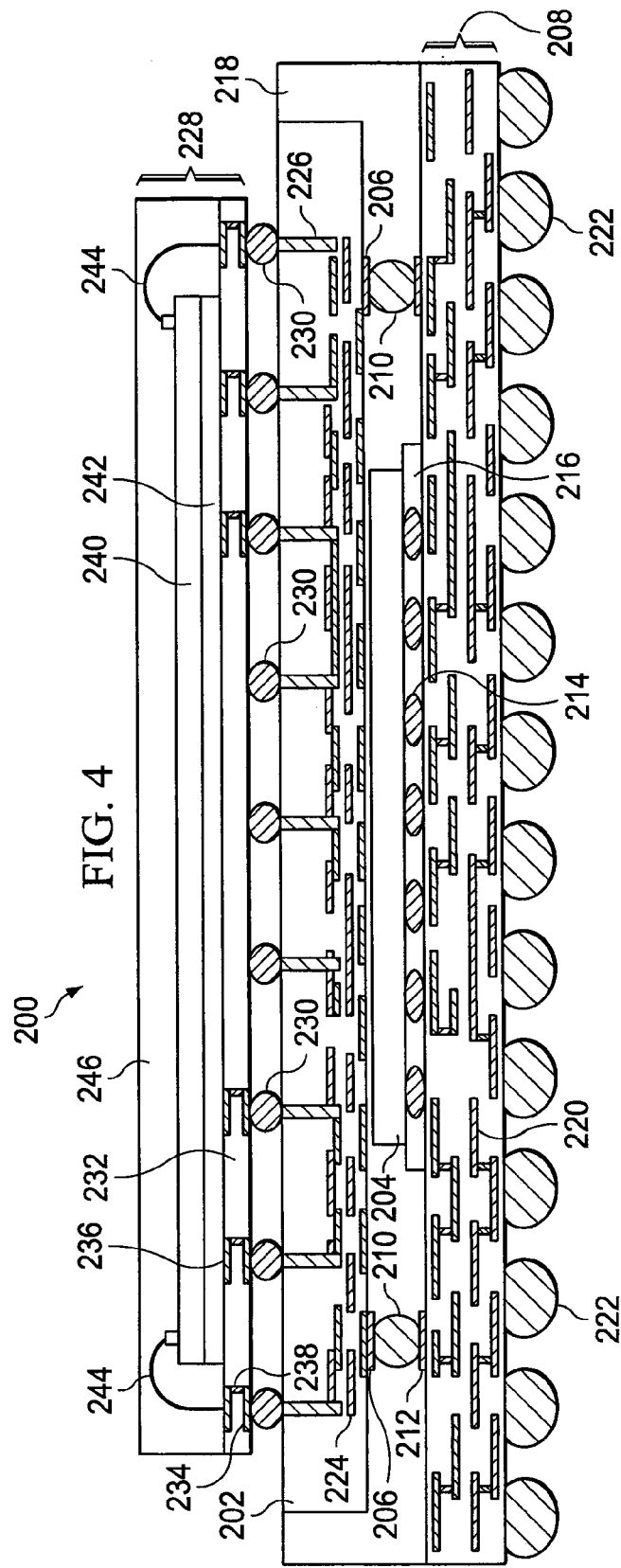
FIG. 4 illustrates a fiPOP package having a flip chip package bottom and a semiconductor package mounted to the fiPOP package.

FIG. 4 illustrates fiPOP package 200 having a flip chip package bottom and a semiconductor package mounted to the fiPOP package. Package 200 includes dies 202 and 204. Dies 202 and 204 include semiconductor devices or other electronic chips or ICs and provide various functions such as memory, controllers, ASICs, processors, microcontrollers, or combinations thereof.

Die 202 includes contact pads 206 formed over a bottom surface of die 202. Build-up structure 224 is formed in die 202 to provide an electrical interconnection network for routing electrical signals from contact pads 206 to both the electrical circuits and TSVs 226 formed in die 202. Build-up structure 224 includes dielectric layers, metalized redistribution layers, and/or under bump metallurgy layers, and is disposed over the active surface of die 202. TSVs 226 are formed by first etching or laser drilling the surface of die 202 to form a recessed portion. A conductive material such as Cu, Ag, or Au is deposited into the recessed portions to form TSVs 226. TSVs 226 connect to build-up structure 224 and are in electrical communication with contact pads 206 formed over die 202. Contact pads 206 are formed using a PVD, CVD, electrolytic plating, or electroless plating process and include a conductive material. PCB 208 includes contact pads 212 formed over a top surface of PCB 208. To mount die 202, a solder material is deposited between contact pads 206 and 212 and reflowed to form solder bumps 210 to provide a mechanical and electrical connection between die 202 and PCB 208.

Die 204 is mounted to PCB 208 using solder bumps 214 formed between die 204 and PCB 208. Underfill 216 is deposited between die 204 and PCB 208 and may include a die attach adhesive or other epoxy polymer material for bonding die 204 and PCB 208. An optional adhesive material may be used to connect dies 202 and 204. Molding or encapsulation material 218 is deposited over dies 202 and 204 to provide physical support and electrical insulation. Molding 218 includes non-conductive materials such as a polymer molding compound, liquid epoxy molding, compression molding, or other molding or encapsulating materials.

PCB 208 includes conductive traces or build-up structure 220 that are formed on a surface or within layers of PCB 208 using evaporation, electrolytic plating, electroless plating, screen printing, or another suitable metal deposition process. Build-up structure 220 forms an electrical interconnection between contact pads 212 formed over a top surface of PCB 208 and a back surface of PCB 208. Solder bumps 222 are formed over the back surface of PCB 208 to allow for external system components to be connected to package 200.

Package 228 is mounted to die 202 using solder bumps 230. Package 228 includes one or more pre-packaged semiconductor die and includes contact pads for connecting to external systems. Package 228 may include general application integrated circuits such as filters, memory chips, and processors. After package 228 is connected to die 202, the systems contained within package 228 are put into communication with the circuitry formed within die 202. In the present embodiment, package 228 includes substrate 232. Substrate 232 includes a PCB or any other substrate material suitable for mounting semiconductor or electronic components. Contact pads 234 and 236 are formed over opposing surfaces of substrate 232 using a PVD, CVD, electrolytic plating, or electroless plating process and include a conductive material. Contact pads 234 and 236 are electrically connected by traces 238 that are formed within layers of substrate 232 using evaporation, electrolytic plating, electroless plating, screen printing, or other suitable metal deposition process. In package 228, semiconductor die 240 is mounted to substrate 232 using adhesive 242. Wirebonds 244 are formed between semiconductor die 240 and contact pads 236. Encapsulant or molding compound 246 is deposited over package 228 to provide physical support and electrical isolation. Package 228 is connected to die 202 using a plurality of solder bumps. Solder material is deposited between contact pads 234 of package 228 and contact pads formed over a surface of die 202. The solder material is reflowed to form solder bumps 230 which form an electrical and mechanical connection between contact pads 234 and die 202. After reflow, solder bumps 230 are electrically connected to TSVs 226 of die 202.

Figure 5:
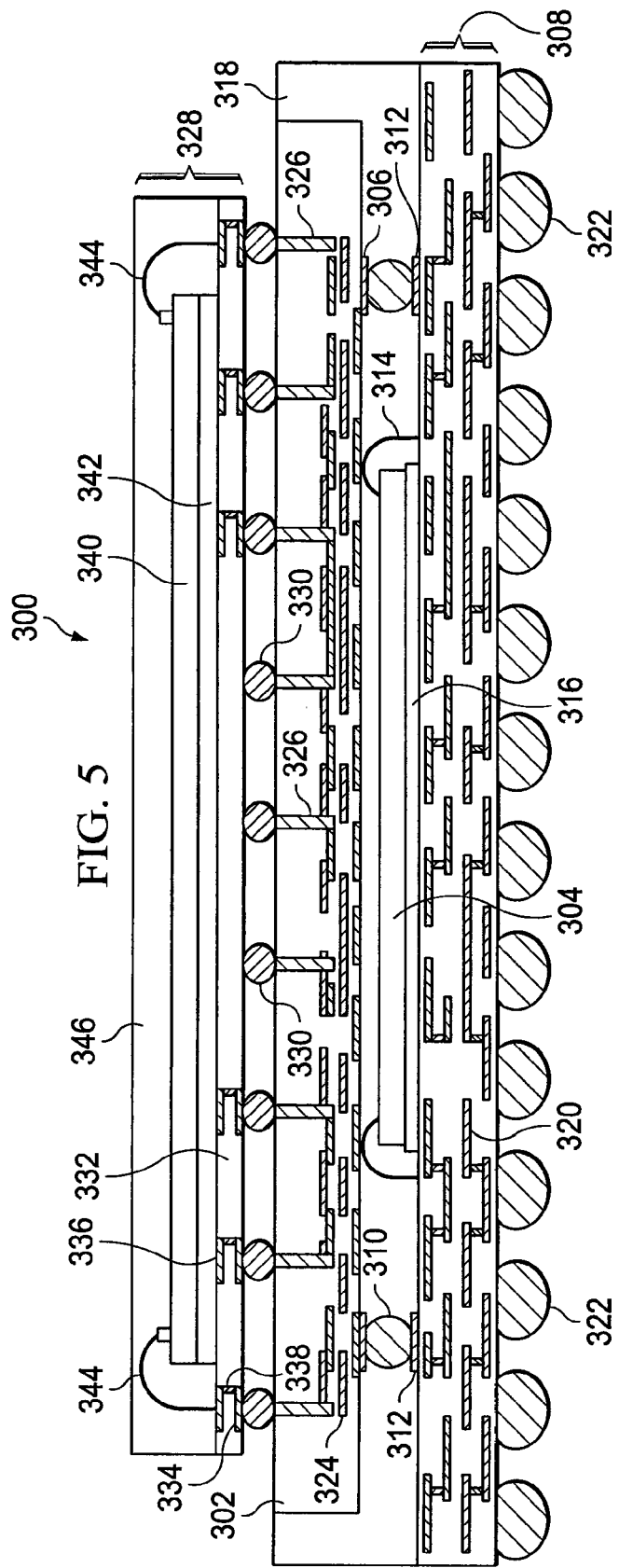
FIG. 5 illustrates a fiPOP package having a wire bonded die package bottom and a semiconductor package mounted to the fiPOP package.

FIG. 5 illustrates fiPOP package 300 having a wire bonded die package bottom and a semiconductor package mounted to the fiPOP package. Package 300 includes dies 302 and 304. Dies 302 and 304 include semiconductor devices and other electronic chips or ICs and provide various functions such as memory, controllers, ASICs, processors, microcontrollers, or combinations thereof.

Die 302 includes contact pads 306 formed over a bottom surface of die 302. Build-up structure 324 is formed in die 302 to provide an electrical interconnection network for routing electrical signals from contact pads 306 to both the electrical circuits and TSVs 326 formed in die 302. Build-up structure 324 includes dielectric layers, metalized redistribution layers, and/or under bump metallurgy layers, and is disposed over the active surface of die 302. TSVs 326 are formed by first etching or laser drilling the surface of die 302 to form a recessed portion. A conductive material such as Cu, Ag, or Au is deposited into the recessed portions to form TSVs 326. TSVs 326 connect to build-up structure 324 and are in electrical communication with contact pads 306 formed over die 302. Contact pads 306 are formed using a PVD, CVD, electrolytic plating, or electroless plating process and include a conductive material. PCB 308 includes contact pads 312 formed over a top surface of PCB 308. To mount die 302, a solder material is deposited between contact pads 306 and 312 and reflowed to form solder bumps 310 to provide a mechanical and electrical connection between die 302 and PCB 308.

Die 304 is mounted to PCB 308 using wire bonds 314 formed between contact pads (not shown) of die 304 and PCB 308. Underfill or adhesive material 316 is deposited between die 304 and PCB 308 and may include a die attach adhesive or other epoxy polymer material for bonding die 304 to PCB 308. An optional adhesive material may be used to connect dies 302 and 304. Molding or encapsulation material 318 is deposited over dies 302 and 304 to provide physical support and electrical insulation. Molding 318 includes non-conductive materials such as a polymer molding compound, liquid epoxy molding, compression molding, or other molding or encapsulating materials.

PCB 308 includes conductive traces or build-up structure 320 that are formed within layers of PCB 308 using evaporation, electrolytic plating, electroless plating, screen printing, or other suitable metal deposition process. Build-up structure 320 forms an electrical interconnection between contact pads 312 formed over a top surface of PCB 308 and the back surface of PCB 308. Solder bumps 322 are formed over the back surface of PCB 308 to allow for external system components to be connected to package 300.

Package 328 is mounted to die 302 using solder bumps 330. Package 328 includes one or more pre-packaged semiconductor die and includes contact pads for connecting to external systems. Package 328 may include general application integrated circuits such as filters, memory chips, and processors. After package 328 is connected to die 302, the systems contained within package 328 are put into communication with the circuitry formed within die 302. In the present embodiment, package 328 includes substrate 332. Substrate 332 includes a PCB or any other substrate material suitable for mounting semiconductor or electronic components. Contact pads 334 and 336 are formed over opposing surfaces of substrate 332 using a PVD, CVD, electrolytic plating, or electroless plating process and include a conductive material. Contact pads 334 and 336 are electrically connected by traces 338 that are formed on a surface or within layers of substrate 332 using evaporation, electrolytic plating, electroless plating, screen printing, or other suitable metal deposition process. In package 328, semiconductor die 340 is mounted to substrate 332 using adhesive 342. Wirebonds 344 are formed between contact pads (not shown) of semiconductor die 340 and contact pads 336. Encapsulant or molding compound 346 is deposited over package 328 to provide physical support and electrical isolation. Package 328 is connected to die 302 using a plurality of solder bumps. Solder material is deposited between contact pads 334 of package 328 and contact pads formed over a surface of die 302. The solder material is reflowed to form solder bumps 330 which form an electrical and mechanical connection between contact pads 334 and die 302. After reflow, solder bumps 330 are electrically connected to TSVs 326 of die 302.

Figures 6, 7:
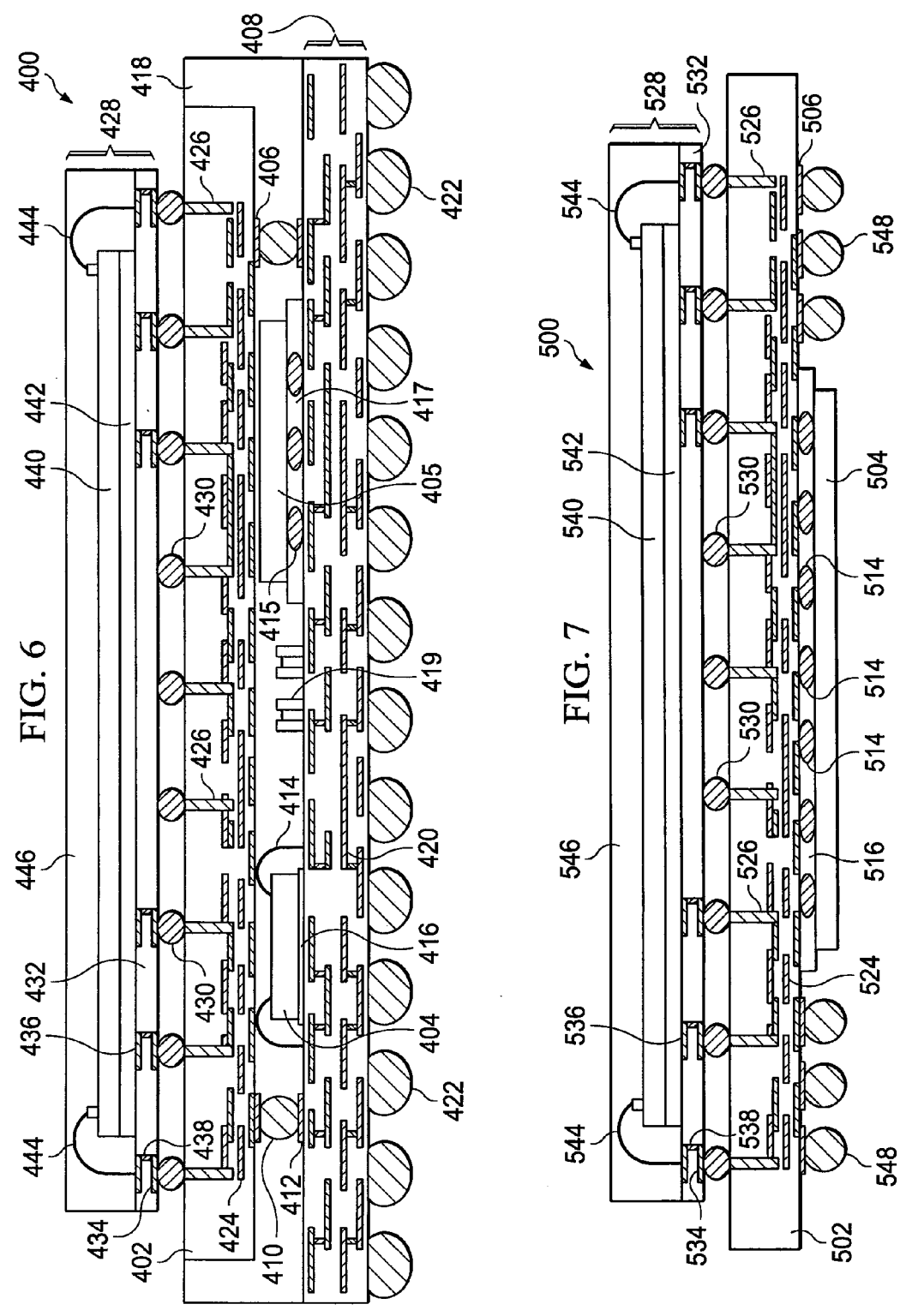

FIG. 6 illustrates fiPOP package 400 having a wire bonded die package bottom, a flip chip bonded die package bottom, a plurality of discrete components and a semiconductor package mounted to the fiPOP package. Package 400 includes dies 402, 404 and 405. Dies 402, 404 and 405 include semiconductor devices and other electronic chips or ICs and provide various functions such as memory, controllers, ASICs, processors, microcontrollers, or combinations thereof.

Die 402 includes contact pads 406 formed over a bottom surface of die 402. Build-up structure 424 is formed in die 402 to provide an electrical interconnection network for routing electrical signals from contact pads 406 to both the electrical circuits and TSVs 426 formed in die 402. Build-up structure 424 includes dielectric layers, metalized redistribution layers, and/or under bump metallurgy layers, and is disposed over the active surface of die 402. TSVs 426 are formed by first etching or laser drilling the surface of die 402 to form a recessed portion. A conductive material such as Cu, Ag, or Au is deposited into the recessed portions to form TSVs 426. TSVs 426 connect to build-up structure 424 and are in electrical communication with contact pads 406 formed over die 402. Contact pads 406 are formed using a PVD, CVD, electrolytic plating, or electroless plating process and include a conductive material.

PCB 408 includes contact pads 412 formed over a top surface of PCB 408. To mount die 402, a solder material is deposited between contact pads 406 and 412 and reflowed to form solder bumps 410 to provide a mechanical and electrical connection between die 402 and PCB 408.

Die 404 is mounted to PCB 408 using wire bonds 414 formed between contact pads (not shown) of die 404 and PCB 408. Underfill or adhesive material 416 is deposited between die 404 and PCB 408 and may include a die attach adhesive or other epoxy polymer material for bonding die 404 and PCB 408.

Die 405 is mounted to PCB 408 using solder bumps 415 formed between die 405 and PCB 408. Underfill 417 is deposited between die 405 and PCB 408 and may include a die attach adhesive or other epoxy polymer material for bonding die 404 and PCB 408.

Discrete components 419 are mounted to PCB 408 and are placed in electrical communication with dies 402, 404 and 405 and the other components of package 400. Discrete components 419 may include passive devices such as inductors, capacitors or resistors, or other passive or active circuit elements.

Molding or encapsulation material 418 is deposited over dies 402, 404 and 405 to provide physical support and electrical insulation. Molding 418 includes non-conductive materials such as a polymer molding compound, liquid epoxy molding, compression molding, or other molding or encapsulating materials.

PCB 408 includes conductive traces or build-up structure 420 that are formed on a surface or within layers of PCB 408 using evaporation, electrolytic plating, electroless plating, screen printing, or another suitable metal deposition process. Build-up structure 420 forms an electrical interconnection between contact pads 412 formed over a top surface of PCB 408 and a back surface of PCB 408. Solder bumps 422 are formed over the back surface of PCB 408 to allow for external system components to be connected to package 400.

Package 428 is mounted to die 402 using solder bumps 430. Package 428 includes one or more pre-packaged semiconductor die and includes contact pads for connecting to external systems. Package 428 may include general application integrated circuits such as filters, memory chips, and processors. After package 428 is connected to die 402, the systems contained within package 428 are put into communication with the circuitry formed within die 402. In the present embodiment, package 428 includes substrate 432. Substrate 432 includes a PCB or any other substrate material suitable for mounting semiconductor or electronic components. Contact pads 434 and 436 are formed over opposing surfaces of substrate 432 using a PVD, CVD, electrolytic plating, or electroless plating process and include a conductive material. Contact pads 434 and 436 are electrically connected by traces 438 that are formed on a surface or within layers of substrate 432 using evaporation, electrolytic plating, electroless plating, screen printing, or other suitable metal deposition process. In package 428, semiconductor die 440 is mounted to substrate 432 using adhesive 442. Wirebonds 444 are formed between contact pads (not shown) of semiconductor die 440 and contact pads 436. Encapsulant or molding compound 446 is deposited over package 428 to provide physical support and electrical isolation. Package 428 is connected to die 402 using a plurality of solder bumps. Solder material is deposited between contact pads 434 of package 428 and contact pads formed over a surface of die 402. The solder material is reflowed to form solder bumps 430 which form an electrical and mechanical connection between contact pads 434 and die 402. After reflow, solder bumps 430 are electrically connected to TSVs 426 of die 402.

FIG. 7 illustrates fiPOP package 500 having a flip chip package bottom configured to connect directly to a motherboard or other primary PCB. Package 500 includes dies 502 and 504. Dies 502 and 504 include semiconductor devices and other electronic chips or ICs and provide various functions such as memory, controllers, ASICs, processors, microcontrollers, or combinations thereof.

Die 502 includes contact pads 506 formed over a bottom surface of die 502. Build-up structure 524 is formed in die 502 to provide an electrical interconnection network for routing electrical signals from contact pads 506 to both the electrical circuits and TSVs 526 formed in die 502. Build-up structure 524 includes dielectric layers, metalized redistribution layers, and/or under bump metallurgy layers, and is disposed over the active surface of die 502. TSVs 526 are formed by first etching or laser drilling the surface of die 502 to form a recessed portion. A conductive material such as Cu, Ag, or Au is deposited into the recessed portions to form TSVs 526. TSVs 526 connect to build-up structure 524 and are in electrical communication with contact pads 506 formed over die 502. Contact pads 506 are formed using a PVD, CVD, electrolytic plating, or electroless plating process and include a conductive material. Die 504 is mounted to die 502 using solder bumps 514 formed between die 504 and die 502. Underfill 516 is deposited between die 504 and die 502 and may include a die attach adhesive or other epoxy polymer material for bonding die 504 and die 502.

Package 528 is mounted to die 502 using solder bumps 530. Package 528 includes one or more pre-packaged semiconductor die and includes contact pads for connecting to external systems. Package 528 may include general application integrated circuits such as filters, memory chips, and processors. After package 528 is connected to die 502, the systems contained within package 528 are put into communication with the circuitry formed within die 502. In the present embodiment, package 528 includes substrate 532. Substrate 532 includes a PCB or any other substrate material suitable for mounting semiconductor or electronic components. Contact pads 534 and 536 are formed over opposing surfaces of substrate 532 using a PVD, CVD, electrolytic plating, or electroless plating process and include a conductive material. Contact pads 534 and 536 are electrically connected by traces 538 that are formed on a surface or within layers of substrate 532 using evaporation, electrolytic plating, electroless plating, screen printing, or other suitable metal deposition process. In package 528, semiconductor die 540 is mounted to substrate 532 using adhesive 542. Wirebonds 544 are formed between contact pads (not shown) of semiconductor die 540 and contact pads 536. Encapsulant or molding compound 546 is deposited over package 528 to provide physical support and electrical isolation. Package 528 is connected to die 502 using a plurality of solder bumps. Solder material is deposited between contact pads 534 of package 528 and contact pads formed over a surface of die 502. The solder material is reflowed to form solder bumps 530 which form an electrical and mechanical connection between contact pads 534 and die 502. After reflow, solder bumps 530 are electrically connected to TSVs 526 of die 502. Solder bumps 548 are formed over the back surface of die 502 to allow for external system components to be connected to package 500 or for flip-chip mounting of package 500.

Figure 8:
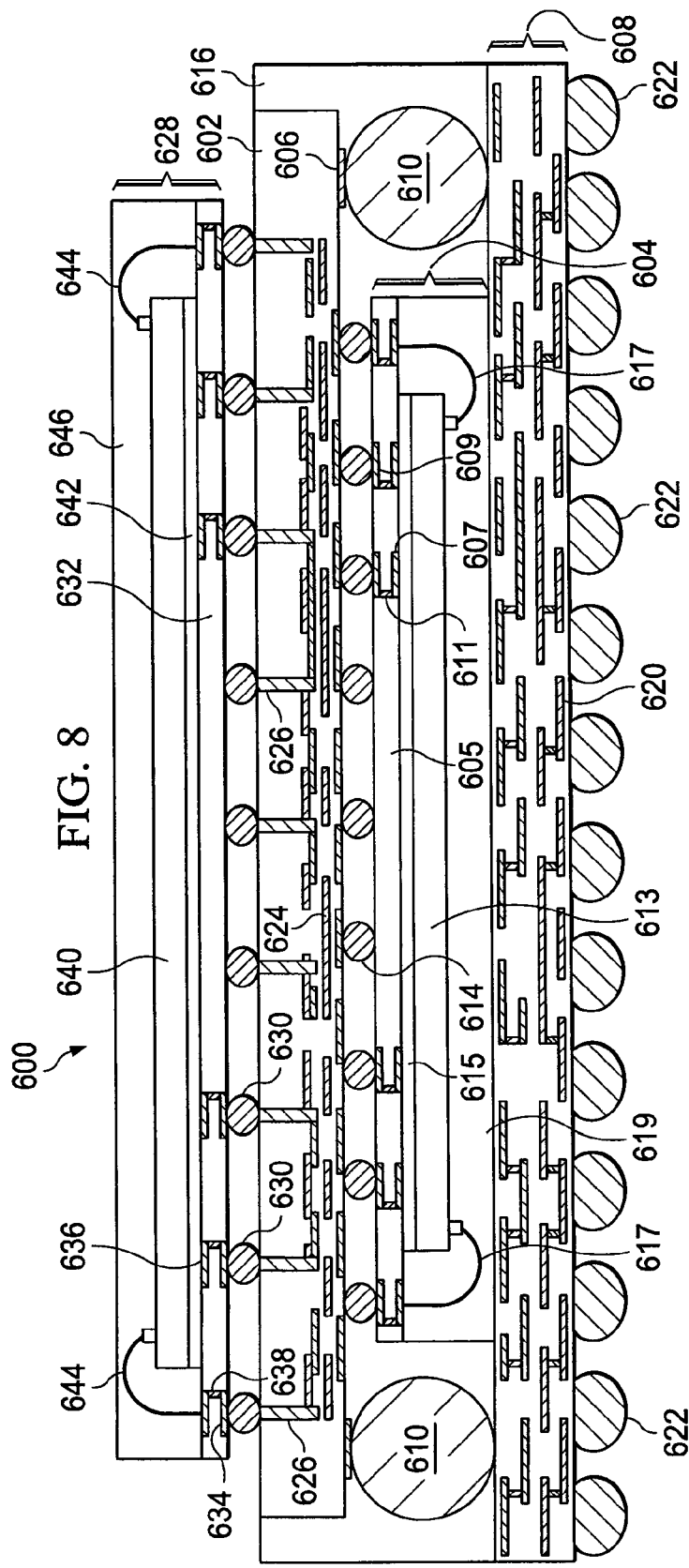
FIG. 8 illustrates a fiPOP package having a known-good unit (KGU) attached to a bottom surface of a die, the die is connected to a PCB using conductive bumps.

FIG. 8 illustrates fiPOP package 600 having KGU 604 attached to a bottom surface of TSV die 602, die 602 is connected to a PCB substrate using conductive bumps. Package 600 includes die 602 and KGU 604. Die 602 includes semiconductor devices and other electronic chips or ICs and provide various functions such as memory, controllers, ASICs, processors, microcontrollers, or combinations thereof.

Die 602 includes contact pads 606 formed over a bottom surface of die 602. Build-up structure 624 is formed in die 602 to provide an electrical interconnection network for routing electrical signals from contact pads 606 to both the electrical circuits and TSVs 626 formed in die 602. Build-up structure 624 includes dielectric layers, metalized redistribution layers, and/or under bump metallurgy layers, and is disposed over the active surface of die 602. TSVs 626 are formed by first etching or laser drilling the surface of die 602 to form a recessed portion. A conductive material such as Cu, Ag, or Au is deposited into the recessed portions to form TSVs 626. TSVs 626 connect to build-up structure 624 and are in electrical communication with contact pads 606 formed over die 602. Contact pads 606 are formed using a PVD, CVD, electrolytic plating, or electroless plating process and include a conductive material.

KGU 604 is mounted to die 602 using solder bumps 614 formed between KGU 604 and die 602. KGU 604 includes one or more pre-packaged semiconductor die and includes contact pads for connecting to external systems. KGU 604 may include general application integrated circuits such as filters, memory chips, and processors. After KGU 604 is connected to die 602, the systems contained within KGU 604 are put into communication with the circuitry formed within die 602. In the present embodiment, KGU 604 includes substrate 605. Substrate 605 includes a PCB or any other substrate material suitable for mounting semiconductor or electronic components. Contact pads 607 and 609 are formed over opposing surfaces of substrate 605 using a PVD, CVD, electrolytic plating, or electroless plating process and include a conductive material. Contact pads 607 and 609 are electrically connected by traces 611 that are formed on a surface or within layers of substrate 605. In KGU 604, semiconductor die 613 is mounted to substrate 605 using adhesive 615. Wirebonds 617 are formed between semiconductor die 613 and contact pads 607. Encapsulant or molding compound 619 is deposited over KGU 604 to provide physical support and electrical isolation. KGU 604 is connected to die 602 using a plurality of solder bumps. Solder material is deposited between contact pads 609 of KGU 604 and contact pads formed over a surface of die 602. The solder material is reflowed to form solder bumps 614 which form an electrical and mechanical connection between contact pads 609 and die 602. After mounting, a back surface of KGU 604 may be connected to PCB 608 using an optional adhesive material.

Die 602 is mounted to PCB 608 using a plurality of solder bumps. PCB 608 includes conductive traces or build-up structure 620 that are formed on a surface or within layers of PCB 608 using evaporation, electrolytic plating, electroless plating, screen printing, or another suitable metal deposition process. To mount die 602, a solder material is deposited between contact pads 606 of die 602 and PCB 608 and reflowed to form solder bumps 610 to provide a mechanical and electrical connection between die 602 and PCB 608. Underfill or encapsulant 616 is deposited over die 602 and KGU 604 and may include a die attach adhesive or other epoxy molding polymer material for providing mechanical and electrical isolation.

Package 628 is mounted to die 602 using solder bumps 630. Package 628 includes one or more pre-packaged semiconductor die and includes contact pads for connecting to external systems. Package 628 may include general application integrated circuits such as filters, memory chips, and processors. After package 628 is connected to die 602, the systems contained within package 628 are put into communication with the circuitry formed within die 602. In the present embodiment, package 628 includes substrate 632. Substrate 632 includes a PCB or any other substrate material suitable for mounting semiconductor or electronic components. Contact pads 634 and 636 are formed over opposing surfaces of substrate 632 using a PVD, CVD, electrolytic plating, or electroless plating process and include a conductive material. Contact pads 634 and 636 are electrically connected by traces 638 that are formed on a surface or within layers of substrate 632. In package 628, semiconductor die 640 is mounted to substrate 632 using adhesive 642. Wirebonds 644 are formed between semiconductor die 640 and contact pads 636. Encapsulant or molding compound 646 is deposited over package 628 to provide physical support and electrical isolation. Package 628 is connected to die 602 using a plurality of solder bumps. Solder material is deposited between contact pads 634 of package 628 and contact pads formed over a surface of die 602. The solder material is reflowed to form solder bumps 630 which form an electrical and mechanical connection between contact pads 634 and die 602. After reflow, solder bumps 630 are electrically connected to TSVs 626 of die 602.

Solder bumps 622 are formed over the back surface of PCB 608 in electrical communication with traces 620 to allow for external system components to be connected to package 600. In alternative embodiments, solder bumps 622 are replaced by conductive studs or pillars, wirebonds, or other interconnect structures for connecting to other system components. Additional system components, passive devices, or discrete components may be connected to device 600 through bumps 622 or another interconnect structure to provide additional functionality.

Figure 9:
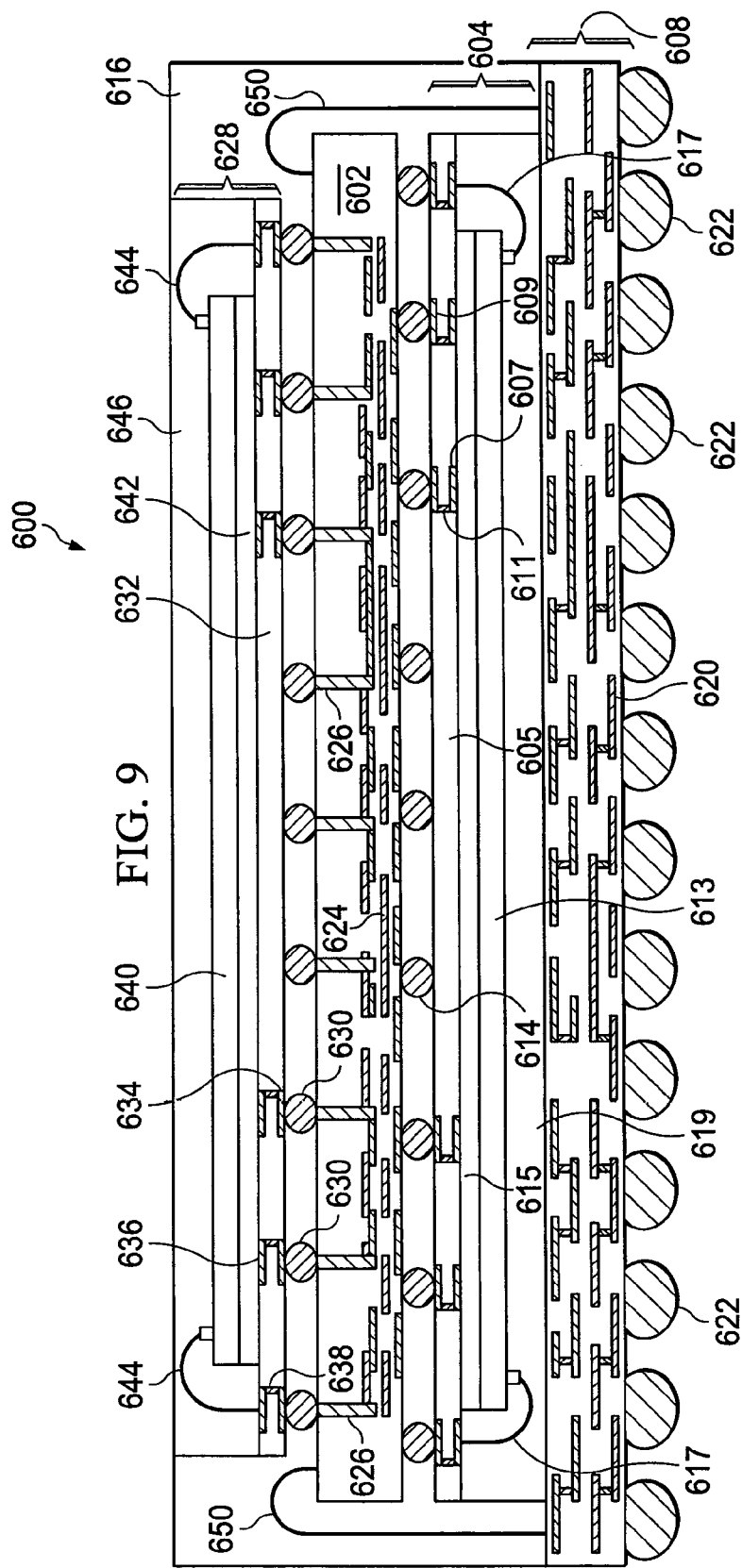
FIG. 9 illustrates a fiPOP package having a KGU attached to a bottom surface of a die, the die is connected to a PCB using wirebonds.

FIG. 9 illustrates a fiPOP package having a KGU attached to a bottom surface of a TSV die, the die is connected to a PCB using wirebonds. Specifically, FIG. 9 illustrates an alternative method for mounting die 602 of FIG. 8 to substrate 608. In package 600, KGU 604 is mounted to die 602 using a plurality of solder bumps 614. A backside of KGU 604 may be connected to PCB 608 using an optional adhesive material. Die 602 includes semiconductor devices and other electronic chips or ICs and provide various functions such as memory, controllers, ASICS, processors, microcontrollers, or combinations thereof.

Die 602 and KGU 604 are mounted to PCB 608. Wirebonds 650 are formed between die 602 and PCB 608 to electrically interconnect die 602 and PCB 608. Package 628 is mounted over die 602 and bumps 630 are formed to electrically and mechanically connect package 628 and die 602. Encapsulant 616 is deposited over die 602, and KGUs 604 and 628.

Figure 10A:
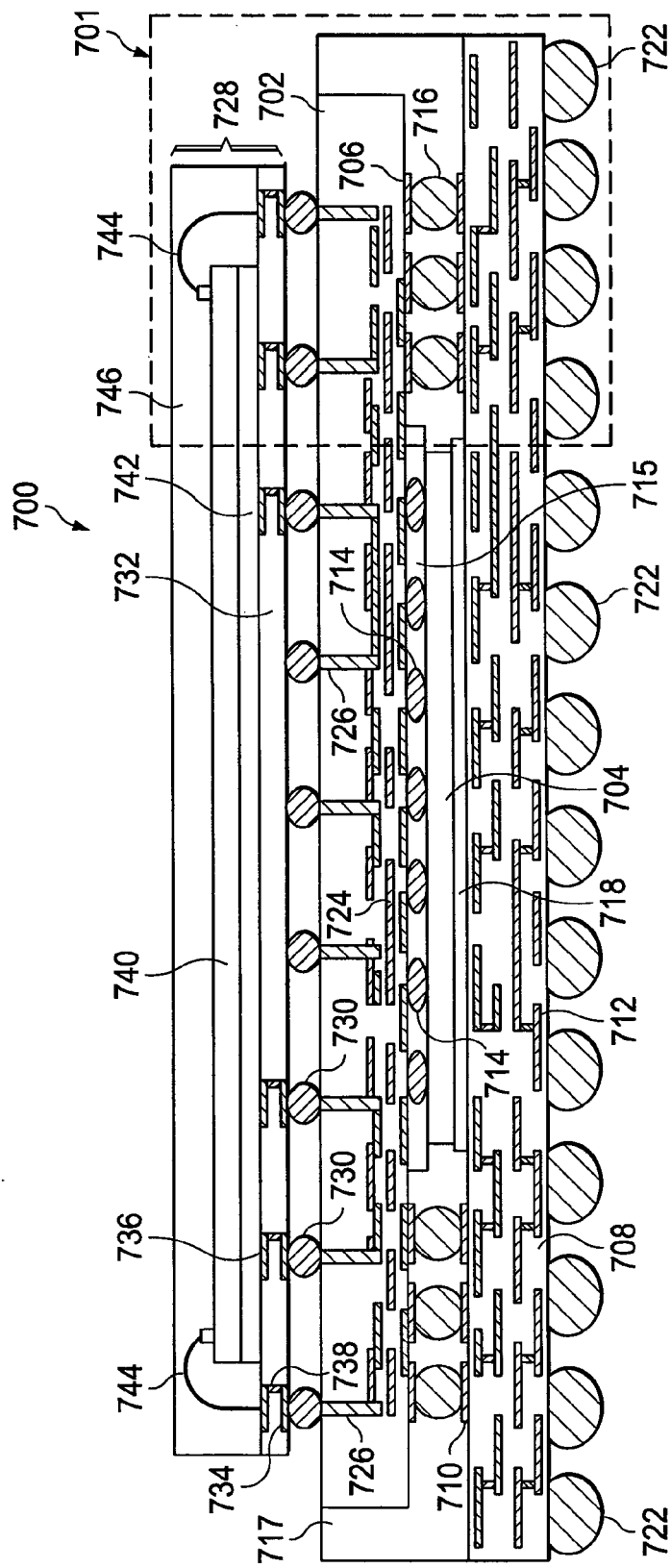
FIGS. 10a and 10b illustrate a flip-chip package-on-package (fcPOP) package including a first die and a second die mounted to the package using a molded underfill (MUF) material.
Figure 10B:
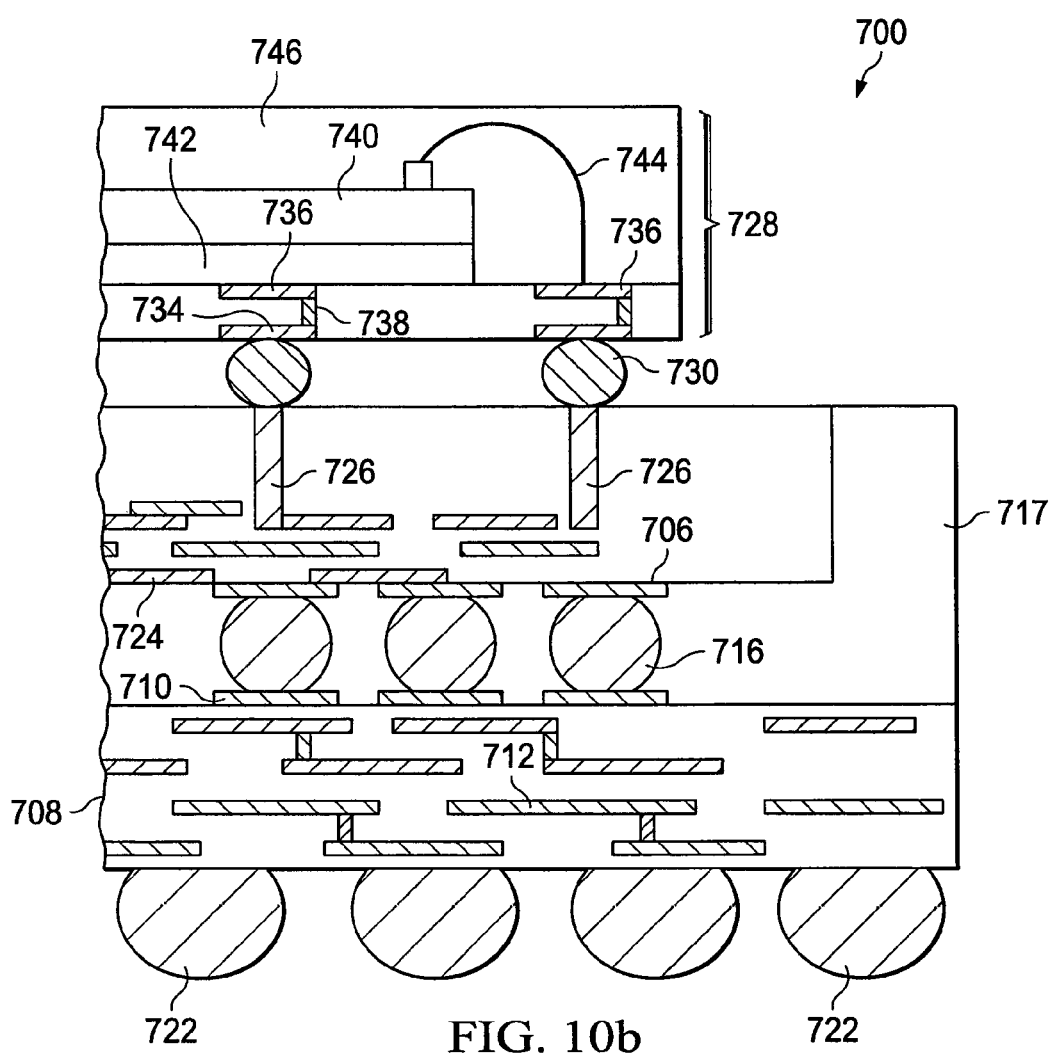

FIGS. 10a and 10b illustrate flip-chip package-on-package (fcPOP) package 700 including a first TSV die and a second die mounted to the package using a molded underfill (MUF) material. FIG. 10b illustrates a detailed view of the portion of package 700 shown in dashed region 701. Package 700 includes dies 702 and 704. Dies 702 and 704 include semiconductor devices and other electronic chips or ICs and provide various functions such as memory, controllers, ASICs, processors, microcontrollers, or combinations thereof.

Die 702 includes contact pads 706 formed over a bottom surface of die 702. Build-up structure 724 is formed in die 702 to provide an electrical interconnection network for routing electrical signals from contact pads 706 to both the electrical circuits and TSVs 726 formed in die 702. Build-up structure 724 includes dielectric layers, metalized redistribution layers, and/or under bump metallurgy layers, and is disposed over the active surface of die 702. TSVs 726 are formed by first etching or laser drilling the surface of die 702 to form a recessed portion. A conductive material such as Cu, Ag, or Au is deposited into the recessed portions to form TSVs 726. TSVs 726 connect to build-up structure 724 and are in electrical communication with contact pads 706 formed over die 702. Contact pads 706 are formed using a PVD, CVD, electrolytic plating, or electroless plating process and include a conductive material. Die 704 is mounted to die 702 using solder bumps 714 formed between die 704 and die 702. Molded underfill 715 is deposited between die 704 and die 702 to enhance the mechanical connection between dies 702 and 704.

Dies 702 and 704 are mounted to printed circuit board PCB 708. PCB 708 includes a general substrate material for structural support and electrical interconnect of the semiconductor packages and other electronic components mounted on the PCB. Contact pads 710 are formed on a surface of PCB 708. Conductive traces and/or build-up structure 712 are formed on a surface or within layers of PCB 708 using evaporation, electrolytic plating, electroless plating, screen printing, or another suitable metal deposition process. Build-up structure 712 provides for electrical communication between each of the mounted dies, connected external system components, and contact pads 710. Solder material is deposited between contact pads 706 of die 702 and contact pads 710 of PCB 708. The solder material is reflowed to form solder bumps 716. Bumps 716 form an electrical and mechanical connection between die 702 and PCB 708. Adhesive material 718 is deposited between die 704 and PCB 708. Adhesive 718 may include an underfill or epoxy-resin material. Molding or encapsulation material 717 is deposited over dies 702, and 704 to provide physical support and electrical insulation. Encapsulant 717 includes non-conductive materials such as a polymer molding compound, liquid epoxy molding, compression molding, or other molding or encapsulating materials.

Package 728 is mounted to die 702 using solder bumps 730. Package 728 includes one or more pre-packaged semiconductor die and includes contact pads for connecting to external systems. Package 728 may include general application integrated circuits such as filters, memory chips, and processors. After package 728 is connected to die 702, the systems contained within package 728 are put into communication with the circuitry formed within die 702. In the present embodiment, package 728 includes substrate 732. Substrate 732 includes a PCB or any other substrate material suitable for mounting semiconductor or electronic components. Contact pads 734 and 736 are formed over opposing surfaces of substrate 732 using a PVD, CVD, electrolytic plating, or electroless plating process and include a conductive material. Contact pads 734 and 736 are electrically connected by traces 738 that are formed on a surface or within layers of substrate 732 using evaporation, electrolytic plating, electroless plating, screen printing, or other suitable metal deposition process. In package 728, semiconductor die 740 is mounted to substrate 732 using adhesive 742. Wirebonds 744 are formed between semiconductor die 740 and contact pads 736. Encapsulant or molding compound 746 is deposited over package 728 to provide physical support and electrical isolation. Package 728 is connected to die 702 using a plurality of solder bumps. Solder material is deposited between contact pads 734 of package 728 and contact pads formed over a surface of die 702. The solder material is reflowed to form solder bumps 730 which form an electrical and mechanical connection between contact pads 734 and die 702. After reflow, solder bumps 730 are electrically connected to TSVs 726 of die 702.

Solder bumps 722 are formed over a bottom surface of PCB 708 using a reflow process. Solder bumps 722 include Au, or Cu structures or another conductive material such as Sn/Pb, CuZn, or CuAg solder each containing an optional flux material. Other system components may be connected to solder bumps 722 and package 700.

Figure 11:
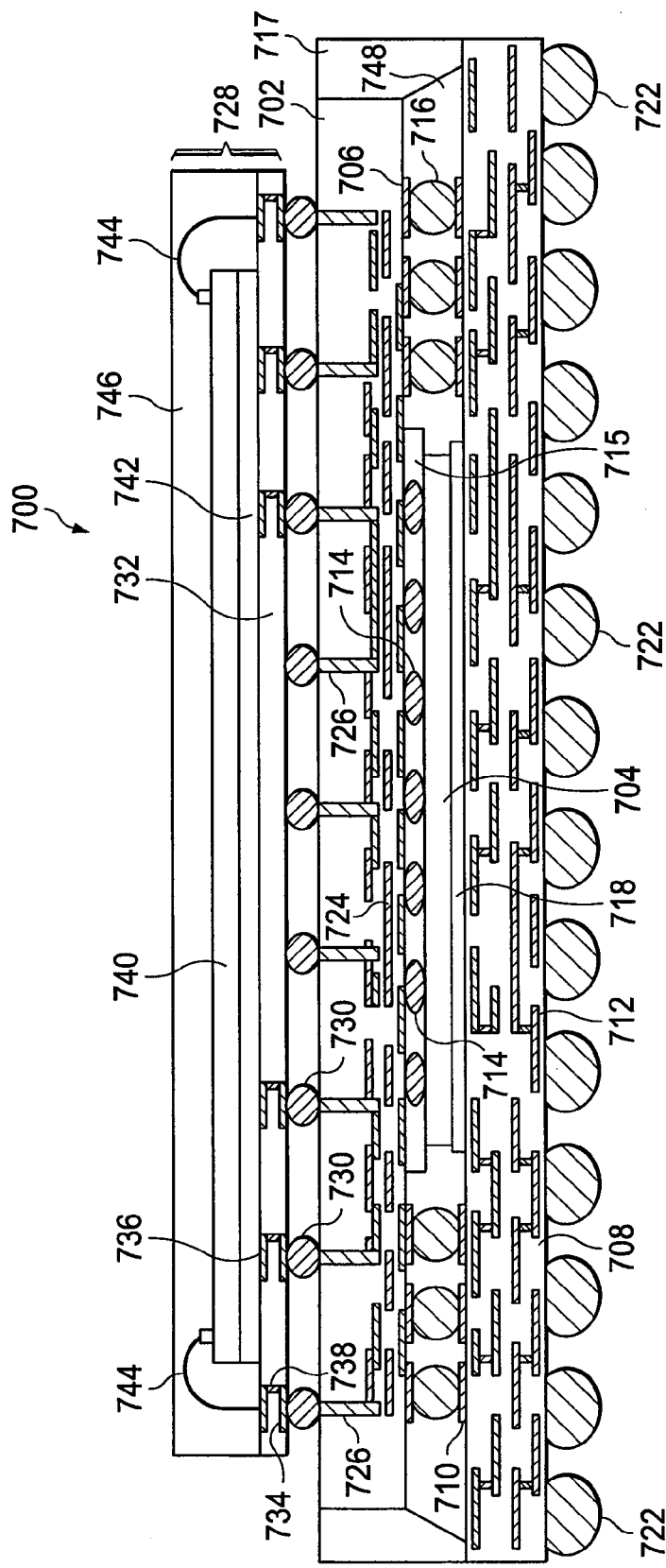
FIG. 11 illustrates a fcPOP including a first TSV die and a second die mounted to the package using a capillary underfill material.

FIG. 11 illustrates fcPOP 700 including a first TSV die and a second die mounted to the package using a capillary underfill material. Accordingly, FIG. 11 illustrates an alternative method for forming an underfill material between dies 702 and 704 of package 700. In package 700, die 702 is mounted to die 704 using bumps 714 and underfill 715. Dies 702 and 704 are mounted to PCB 708 using bumps 716 and adhesive material 718. After mounting dies 702 and 704, underfill 748 is deposited between dies 702 and 704 and PCB 708. Capillary action causes underfill 748 to flow between dies 702 and 704 to enclose bumps 716 and to form a physical bond between dies 702 and 704. Package 728 is mounted over die 702 and is electrically connected to TSVs 726 formed with die 702. Bumps 722 are formed over a back surface of PCB 708 to provide an interconnect structure for mounting package 700 to external system components. In alternative embodiments, other conductive structures such as conductive pillars, studs, or wirebonds are connected to PCB 708 to provide an interconnect structure for external system components.

Figure 12A:
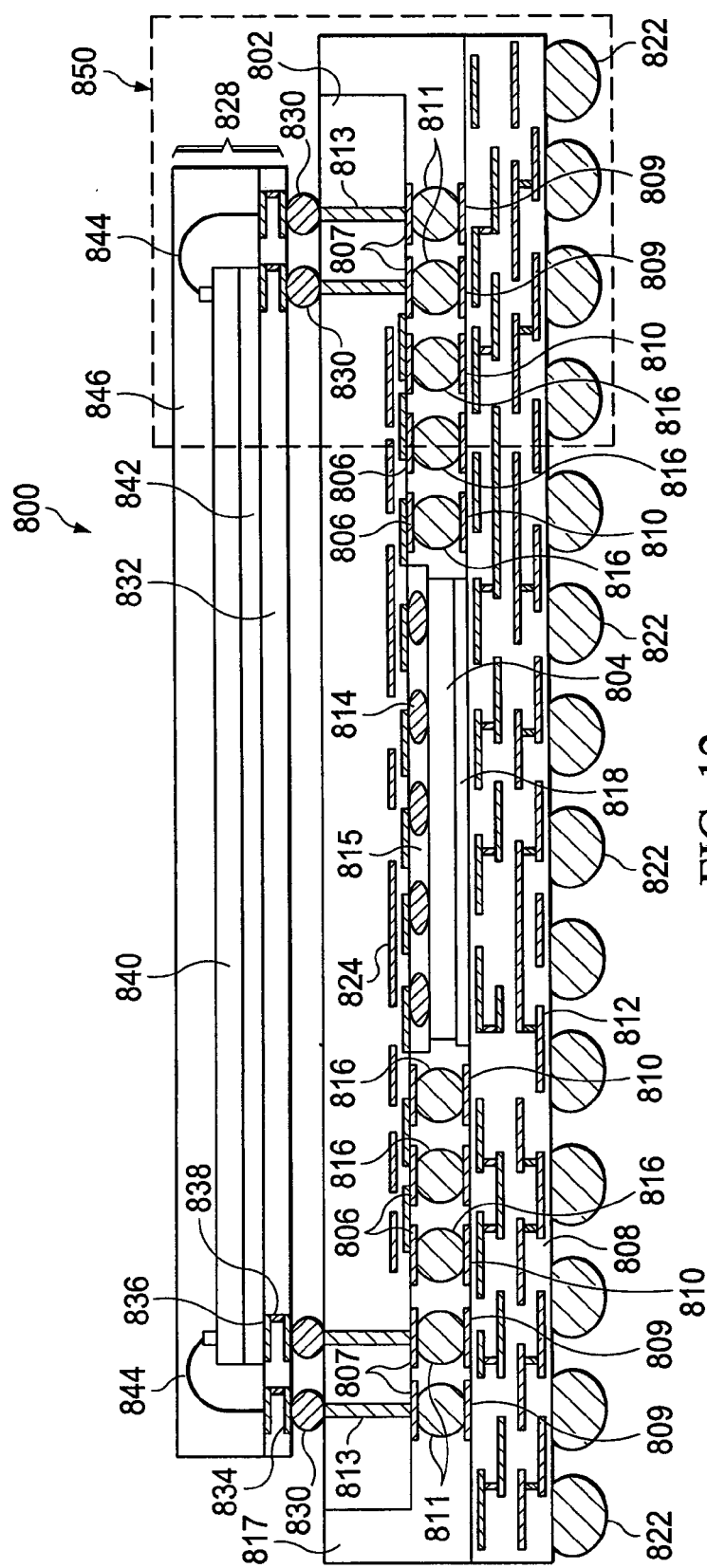
FIGS. 12a and 12b illustrate a fiPOP package including a TSV die having a plurality of TSVs formed around a perimeter region of the die.
Figure 12B:
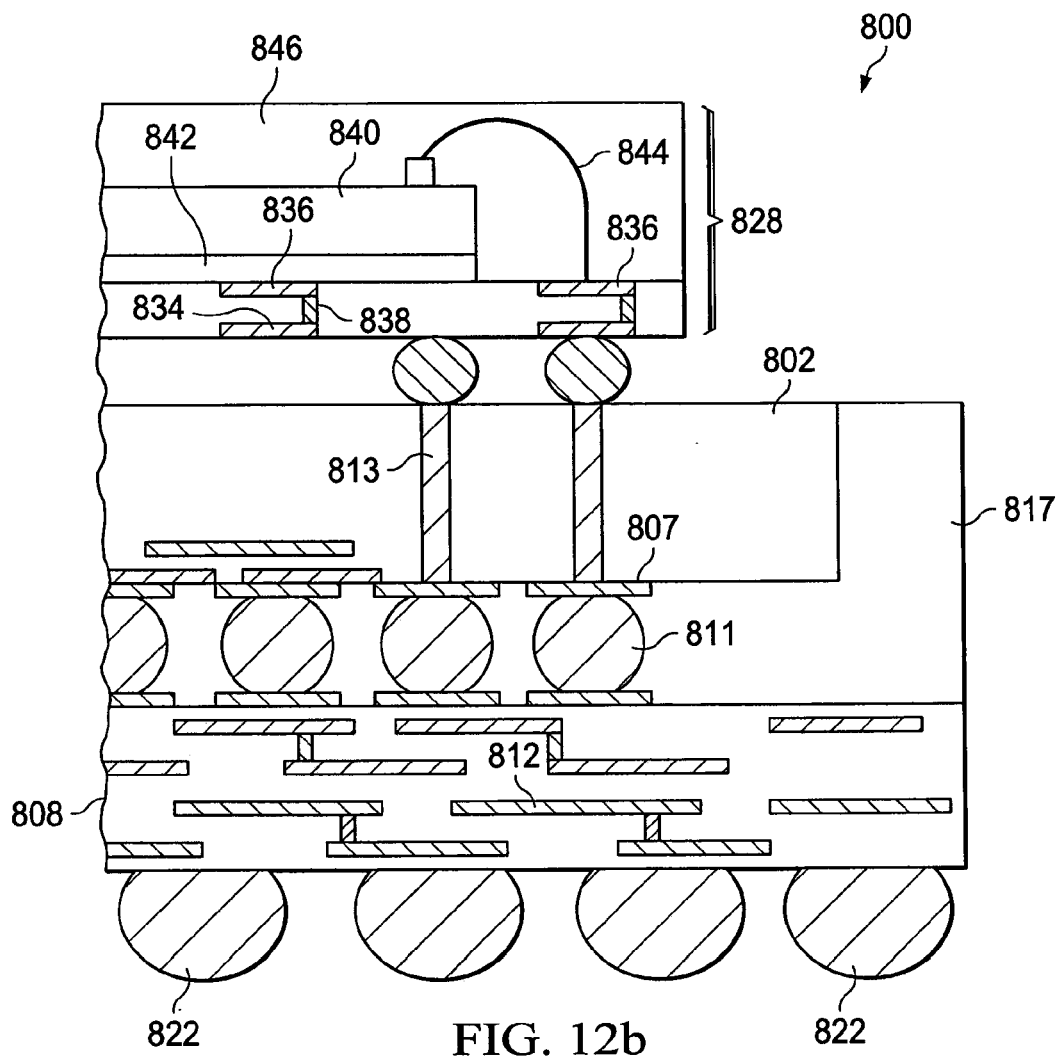

FIGS. 12a and 12b illustrate fiPOP package 800 including a TSV die having a plurality of TSVs formed around a perimeter region of the die. FIG. 12b illustrates a detailed view of the portion of package 800 shown in dashed region 850. Package 800 includes dies 802 and 804. Dies 802 and 804 include semiconductor devices and other electronic chips or ICs and provide various functions such as memory, controllers, ASICs, processors, microcontrollers, or combinations thereof.

Die 802 includes contact pads 806 formed over a bottom surface of die 802. Build-up structure 824 is formed in die 802 to provide an electrical interconnection network for routing electrical signals between contact pads 806 and the electrical circuits formed in die 802. Build-up structure 824 includes dielectric layers, metalized redistribution layers, and/or under bump metallurgy layers, and is disposed over the active surface of die 802. Contact pads 806 are formed using a PVD, CVD, electrolytic plating, or electroless plating process and include a conductive material. Die 802 includes TSVs 813. TSVs 813 are formed by first etching or laser drilling the surface of die 802 to form a recessed portion. A conductive material such as Cu, Ag, or Au is deposited into the recessed portions to form TSVs 813. Contact pads 807 are formed over a surface of die 802 using a PVD, CVD, electrolytic plating, or electroless plating process and are connected to TSVs 813.

Die 804 is mounted to die 802 using solder bumps 814 formed between die 804 and die 802 to form a chip-on-chip package. Molded underfill 815 is deposited between die 804 and die 802 to enhance the mechanical connection between dies 802 and 804.

Dies 802 and 804 are mounted to printed circuit board PCB 808. PCB 808 includes a general substrate material for structural support and electrical interconnect of the semiconductor packages and other electronic components mounted to the PCB. Contact pads 809 and 810 are formed on a surface of PCB 808. Conductive traces and/or build-up structure 812 are formed on a surface or within layers of PCB 808 using evaporation, electrolytic plating, electroless plating, screen printing, or another suitable metal deposition process. Build-up structure 812 provides for electrical communication between each of the mounted dies, connected external system components, and contact pads 809 and 810. Solder material is deposited between contact pads 806 and 807 of die 802 and contact pads 809 and 810 of PCB 808. The solder material is reflowed to form solder bumps 816 and 811. Bumps 816 and 811 form an electrical and mechanical connection between die 802 and PCB 808. Adhesive material 818 is deposited between die 804 and PCB 808. Adhesive 818 may include an underfill or epoxy-resin material. Molding or encapsulation material 817 is deposited over dies 802 and 804 to provide physical support and electrical insulation. Encapsulant 817 includes non-conductive materials such as a polymer molding compound, liquid epoxy molding, compression molding, or other molding or encapsulating materials.

Package 828 is mounted to die 802 using solder bumps 830. Package 828 includes one or more pre-packaged semiconductor die and includes contact pads for connecting to external systems. Package 828 may include general application integrated circuits such as filters, memory chips, and processors. After package 828 is connected to die 802, the systems contained within package 828 are put into communication with the circuitry formed within die 802. In the present embodiment, package 828 includes substrate 832. Substrate 832 includes a PCB or any other substrate material suitable for mounting semiconductor or other electronic components. Contact pads 834 and 836 are formed over opposing surfaces of substrate 832 using a PVD, CVD, electrolytic plating, or electroless plating process and include a conductive material. Contact pads 834 and 836 are electrically connected by traces 838 that are formed on a surface or within layers of substrate 832 using evaporation, electrolytic plating, electroless plating, screen printing, or other suitable metal deposition process. In package 828, semiconductor die 840 is mounted to substrate 832 using adhesive 842. Wirebonds 844 are formed between semiconductor die 840 and contact pads 836. Encapsulant or molding compound 846 is deposited over package 828 to provide physical support and electrical isolation. Package 828 is connected to die 802 using a plurality of solder bumps. Solder material is deposited between contact pads 834 of package 828 and contact pads formed over a surface of die 802. The solder material is reflowed to form solder bumps 830 which form an electrical and mechanical connection between contact pads 834 and die 802. After reflow, solder bumps 830 are electrically connected to TSVs 813 of die 802.

Solder bumps 822 are formed over a bottom surface of PCB 808 using a reflow process. Solder bumps 822 include Au, or Cu structures or another conductive material such as Sn/Pb, CuZn, or CuAg solder each containing an optional flux material. Other system components may be connected to solder bumps 822 and package 800. After integration, the functionality of dies 802 and 804 is made available to the external system components. Additional system components, passive devices, or discrete components may be connected to device 800 to provide additional functionality.

In this configuration, bumps 811 provide direct electrical communication between package 828 and external components via through TSVs 813 formed in die 802.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
providing a first semiconductor die including a plurality of conductive vias formed through the first semiconductor die and a build-up interconnect structure formed across an active surface of the first semiconductor die;
disposing a second semiconductor die over the first semiconductor die to form a first semiconductor package, wherein the second semiconductor die includes a plurality of first bumps in direct contact with the build-up interconnect structure;
forming a plurality of second bumps in direct contact with the build-up interconnect structure outside a footprint of the second semiconductor die after forming the first semiconductor package;
providing a substrate including a plurality of first conductive layers formed through the substrate and on a planar first surface of the substrate;
disposing the first semiconductor package over the planar first surface of the substrate with the second bumps in direct contact with the first conductive layers on the planar first surface of the substrate;
disposing a discrete component between the first semiconductor package and substrate;
depositing an encapsulant around the first semiconductor die and between the first semiconductor package and substrate; and
disposing a second semiconductor package over the first semiconductor die opposite the substrate, wherein the second semiconductor package includes a plurality of third bumps in direct contact with the conductive vias.

2. The method of claim 1, wherein the build-up interconnect structure includes:
forming an insulating layer over the active surface of the first semiconductor die; and
forming a second conductive layer over the insulating layer.

3. The method of claim 1, further including depositing the encapsulant between the first semiconductor die and second semiconductor die.

4. A method of making a semiconductor device, comprising:
providing a first semiconductor die including a plurality of conductive vias formed through the first semiconductor die and a build-up interconnect structure formed across an active surface of the first semiconductor die;
disposing a first semiconductor package over the first semiconductor die to form a second semiconductor package;
forming a plurality of first bumps in direct contact with the build-up interconnect structure outside a footprint of the first semiconductor package after forming the second semiconductor package;
providing a substrate including a plurality of first conductive layers formed through the substrate and on a planar first surface of the substrate;
disposing the second semiconductor package over the planar first surface of the substrate with the first bumps in direct contact with the first conductive layers on the planar first surface of the substrate;
depositing an encapsulant around the first semiconductor die and between the second semiconductor package and substrate; and
disposing a third semiconductor package over the first semiconductor die opposite the substrate, wherein the third semiconductor package includes a plurality of second bumps in direct contact with the conductive vias.

5. The method of claim 4, further including disposing a discrete component between the second semiconductor package and substrate.

6. The method of claim 4, wherein the build-up interconnect structure includes:
forming an insulating layer over the active surface of the first semiconductor die; and
forming a second conductive layer over the insulating layer.

7. The method of claim 4, further including depositing the encapsulant between the first semiconductor die and first semiconductor package.

8. The method of claim 4, wherein the first semiconductor package includes a second semiconductor die.

9. The method of claim 8, further including forming an interconnect structure between the second semiconductor die and first semiconductor die.

10. The method of claim 8, further including forming an interconnect structure between the second semiconductor die and substrate.

11. A method of making a semiconductor device, comprising:
providing a first semiconductor die including a plurality of conductive vias formed through the first semiconductor die and a build-up interconnect structure formed across an active surface of the first semiconductor die;
disposing a first semiconductor package over the first semiconductor die to form a second semiconductor package;
disposing the second semiconductor package over a first surface of a substrate;
depositing an encapsulant around the first semiconductor die and between first semiconductor die and the first semiconductor package; and
disposing a third semiconductor package over the second semiconductor package opposite the substrate, wherein the third semiconductor package includes a plurality of first bumps in direct contact with the conductive vias.

12. The method of claim 11, further including forming a plurality of second bumps in direct contact with the build-up interconnect structure outside a footprint of the first semiconductor package after forming the second semiconductor package.

13. The method of claim 11, further including disposing a discrete component between the second semiconductor package and substrate.

14. The method of claim 11, wherein the first semiconductor package includes a second semiconductor die.

15. The method of claim 14, further including forming an interconnect structure between the second semiconductor die and first semiconductor die.

16. The method of claim 14, further including forming an interconnect structure between the second semiconductor die and substrate.

17. A method of making a semiconductor device, comprising:
providing a first semiconductor die including a plurality of conductive vias formed through the first semiconductor die and a build-up interconnect structure formed across an active surface of the first semiconductor die;

disposing a first semiconductor package over the first semiconductor die to form a second semiconductor package;

forming a plurality of first bumps in direct contact with the build-up interconnect structure outside a footprint of the first semiconductor package after forming the second semiconductor package;

depositing an encapsulant around the first semiconductor die; and disposing a third semiconductor package over the second semiconductor package, wherein the third semiconductor package includes a plurality of second bumps in direct contact with the conductive vias.

18. The method of claim 17, further including:

providing a substrate including a plurality of conductive layers formed through the substrate and on a first surface of the substrate;

disposing the first semiconductor package over the first surface of the substrate with the second bumps in direct contact with the conductive layers on the first surface of the substrate; and depositing the encapsulant between the second semiconductor package and substrate.

19. The method of claim 18, further including disposing a discrete component between the second semiconductor package and substrate.

20. The method of claim 17, further including disposing depositing the encapsulant between the first semiconductor die and first semiconductor package.

21. The method of claim 17, wherein the build-up interconnect structure includes:

forming an insulating layer over the active surface of the first semiconductor die; and forming a conductive layer over the insulating layer.

22. The method of claim 17, wherein the first semiconductor package includes a second semiconductor die.

23. The method of claim 22, further including forming an interconnect structure between the second semiconductor die and first semiconductor die.

24. The method of claim 22, further including forming an interconnect structure between the second semiconductor die and substrate.

* * * * *